United States Patent
Chang et al.

(10) Patent No.: US 12,369,294 B2
(45) Date of Patent: Jul. 22, 2025

(54) MULTI-GATE DEVICE AND RELATED METHODS

(71) Applicant: Taiwan Semiconductor Manufacturing Company, Ltd., Hsinchu (TW)

(72) Inventors: Chao-Yuan Chang, New Taipei (TW); Feng-Ming Chang, Hsinchu County (TW); Jui-Wen Chang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 617 days.

(21) Appl. No.: 17/651,061

(22) Filed: Feb. 14, 2022

(65) Prior Publication Data

US 2023/0262950 A1 Aug. 17, 2023

(51) Int. Cl.
*H10D 30/01* (2025.01)
*H10B 10/00* (2023.01)
*H10D 30/67* (2025.01)
*H10D 62/10* (2025.01)
*H10D 64/01* (2025.01)

(52) U.S. Cl.
CPC .......... *H10B 10/125* (2023.02); *H10B 10/18* (2023.02); *H10D 30/031* (2025.01); *H10D 30/6713* (2025.01); *H10D 30/6735* (2025.01); *H10D 30/6757* (2025.01); *H10D 62/118* (2025.01); *H10D 64/018* (2025.01)

(58) Field of Classification Search
CPC ............... H10D 62/116; H10D 62/121; H10D 62/151; H10D 62/822; H10D 64/017; H10D 64/021; H10D 84/0128; H10D 84/038; H10D 84/83; H10D 30/014; H10D 30/43; H10D 30/797
USPC ......................................................... 257/351
See application file for complete search history.

(56) References Cited

U.S. PATENT DOCUMENTS

| | | | |
|---|---|---|---|
| 8,605,523 B2 | 12/2013 | Tao et al. |
| 8,630,132 B2 | 1/2014 | Cheng et al. |
| 8,760,948 B2 | 6/2014 | Tao et al. |
| 2014/0032871 A1 | 1/2014 | Hsu et al. |
| 2014/0153321 A1 | 6/2014 | Liaw |
| 2014/0153345 A1 | 6/2014 | Kim et al. |

(Continued)

FOREIGN PATENT DOCUMENTS

TW 202143444 A 11/2021

*Primary Examiner* — Fazli Erdem
(74) *Attorney, Agent, or Firm* — Haynes and Boone, LLP

(57) ABSTRACT

A method includes providing a substrate having an epitaxial stack of layers including a plurality of semiconductor channel layers interposed by a plurality of dummy layers. The substrate includes a first device region and a second device region. An etch process is performed to remove a first portion of the epitaxial stack of layers from the second device region to form a trench in the second device region. The removed first portion of the epitaxial stack of layers includes at least one semiconductor channel layer of the plurality of semiconductor channel layers. An epitaxial layer is formed within the trench in the second device region and over the second portion of the epitaxial stack of layers. A top surface of the epitaxial layer in the second device region is substantially level with a top surface of the epitaxial stack of layers in the first device region.

20 Claims, 16 Drawing Sheets

(56) References Cited

U.S. PATENT DOCUMENTS

| | | |
|---|---|---|
| 2014/0177352 A1 | 6/2014 | Lum |
| 2014/0233330 A1 | 8/2014 | Ko et al. |
| 2014/0241077 A1 | 8/2014 | Katoch et al. |
| 2014/0269114 A1 | 9/2014 | Yang et al. |
| 2018/0366375 A1* | 12/2018 | Chen ............... H01L 21/823431 |
| 2021/0098302 A1* | 4/2021 | Ju ........................ H10B 10/00 |

* cited by examiner

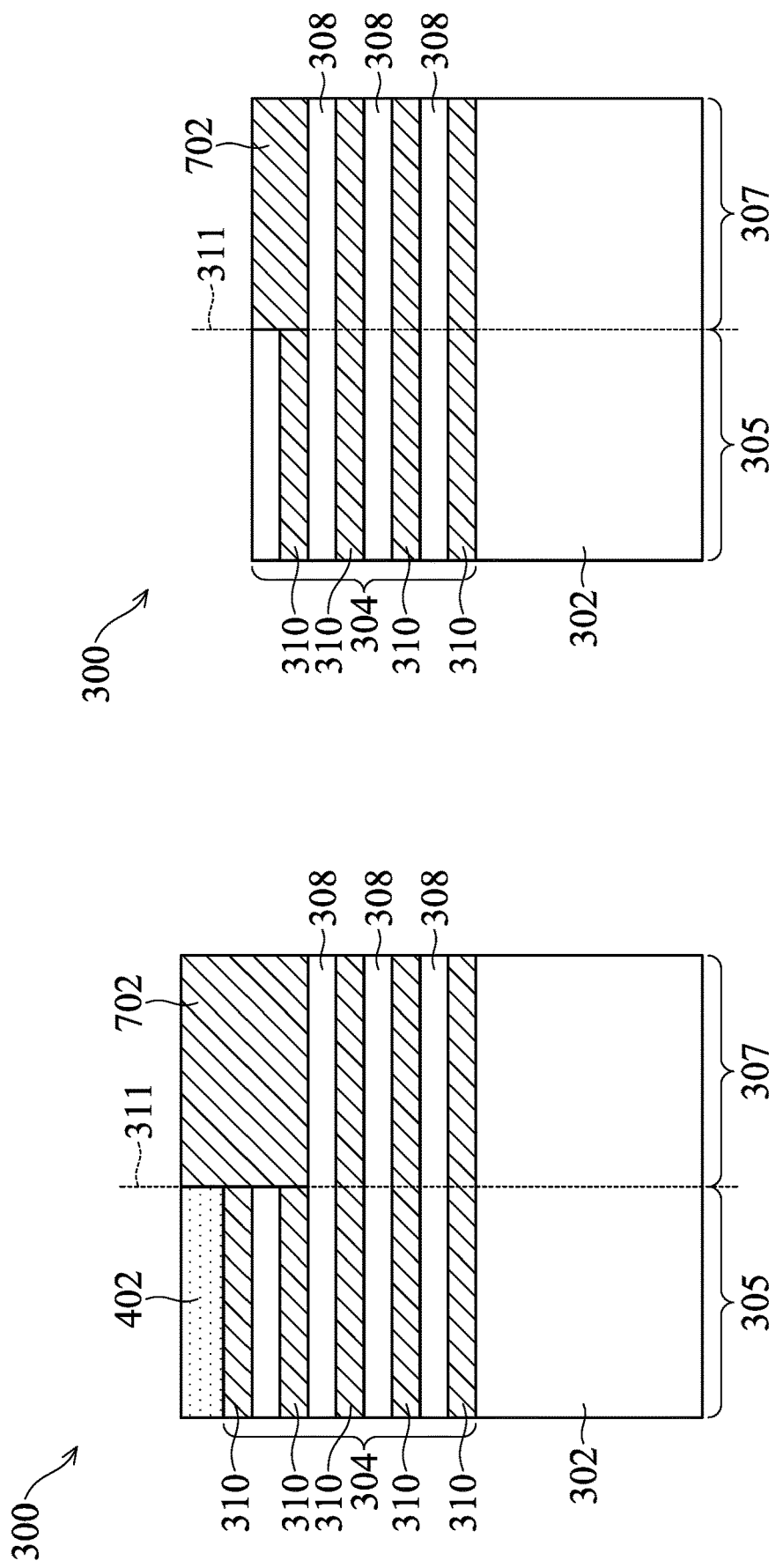

MULTI-GATE DEVICE AND RELATED METHODS

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. Another multi-gate device, introduced in part to address performance challenges associated with FinFETs, is the gate-all-around (GAA) transistor. GAA transistors get their name from the gate structure which extends completely around the channel, providing better electrostatic control than FinFETs. FinFETs and GAA transistors are compatible with conventional complementary metal-oxide-semiconductor (CMOS) processes and their three-dimensional structure allows them to be aggressively scaled while maintaining gate control and mitigating SCEs.

In general, GAA transistors may be implemented, for example, in cases where FinFETs can no longer meet performance requirements. However, a semiconductor IC may generally include a variety of different device types with different performance requirements. As such, providing a multi-gate device (e.g., such as a GAA transistor) that is able to meet such diverse device performance requirements remains a challenge. Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3, 4, 5, 6, 7, 8, 9, 10, and 11 provide cross-sectional views of an embodiment of the semiconductor device 300 along a plane substantially parallel to a plane defined by section AA' of FIG. 1, in accordance with some embodiments;

DETAILED DESCRIPTION

Figure 1:
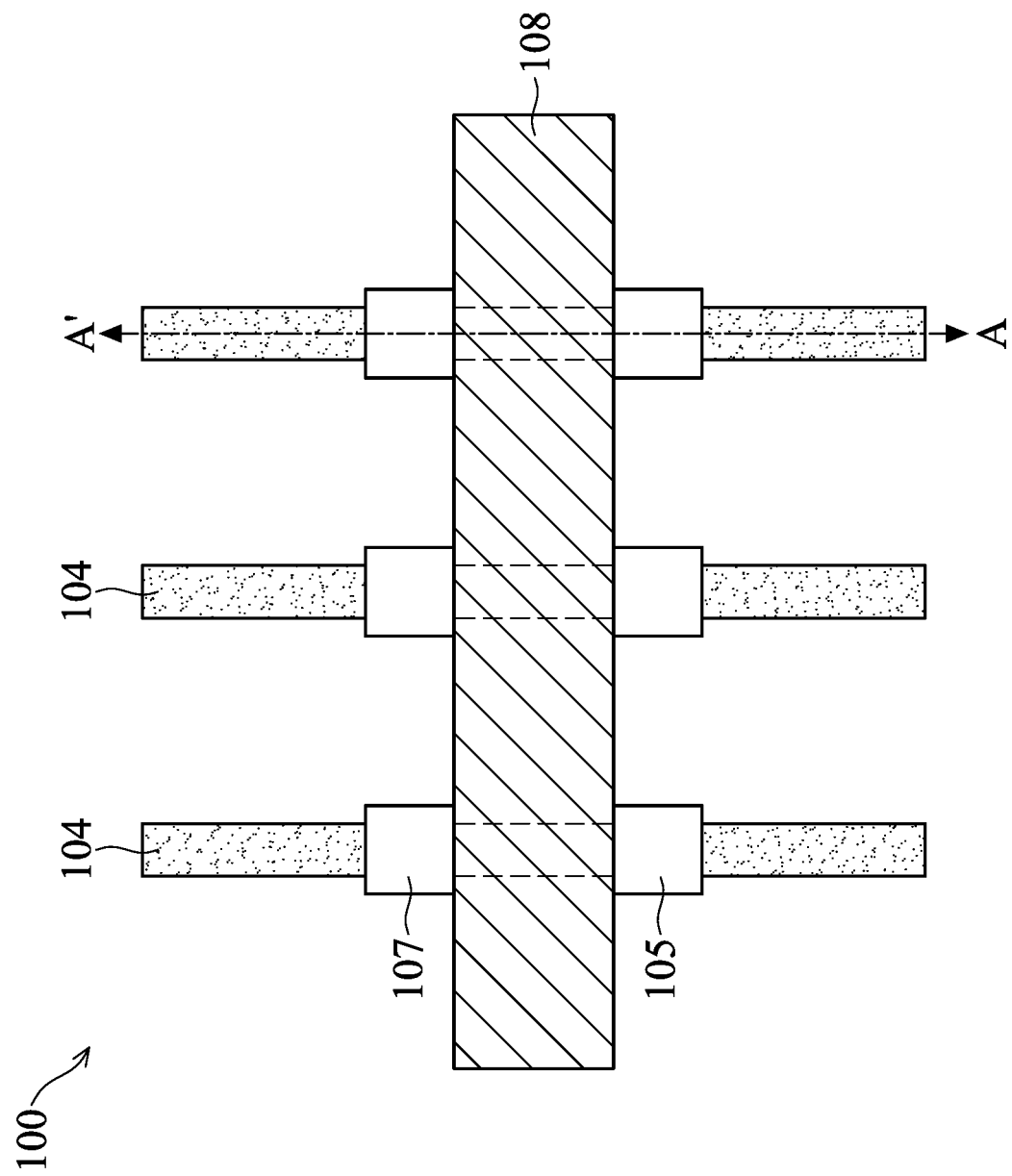
FIG. 1 provides a simplified top-down layout view of a multi-gate device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors. Multi-gate transistors include those transistors whose gate structures are formed on at least two-sides of a channel region. These multi-gate devices may include a P-type metal-oxide-semiconductor device or an N-type metal-oxide-semiconductor multi-gate device. Specific examples may be presented and referred to herein as FinFETs, on account of their fin-like structure. Also presented herein are embodiments of a type of multi-gate transistor referred to as a gate-all-around (GAA) transistor. A GAA transistor includes any device that has its gate structure, or portion thereof, formed on 4-sides of a channel region (e.g., surrounding a portion of a channel region). Devices presented herein also include embodiments that have channel regions disposed in semiconductor channel layers. In various embodiments, the semiconductor channel layers may include nanosheet channel(s), nanowire channel(s), bar-shaped channel(s), and/or other suitable channel configurations. Presented herein are embodiments of devices that may have one or more channel regions (e.g., semiconductor channel layers) associated with a single, contiguous gate structure. However, one of ordinary skill would recognize that the teaching can apply to a single channel (e.g., single semiconductor channel layer) or any number of channels. One of ordinary skill may recognize other examples of semiconductor devices that may benefit from aspects of the present disclosure.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures for providing multi-gate devices (e.g., such as a GAA transistors) having a number of semiconductor channel layers selected based on the device type being implemented by the multi-gate device. GAA transistors may be used in a variety of device types, for example, to implement core (logic) devices and static random-access memory (SRAM) devices, among others. With respect to such various device types implemented using GAA transistors, and in some embodiments, core (logic) devices may be implemented using a fewer number of semiconductor channel layers as compared to SRAM devices. In some examples, core (logic) devices may be implemented using a fewer number of semiconductor channel layers in order to reduce total device capacitance and provide increased device speed (e.g., including improved AC performance). Alternatively, in various embodiments, SRAM devices may be implemented using a greater number of semiconductor channel layers in order to provide increased cell current, as well as to reduce variation of transistor threshold voltage and transistor current. In some examples, the number of semiconductor channel layers for a core (logic) device may be less than or equal to three (3), and the number of semiconductor channel layers for SRAM devices may be greater than or equal to four (4). Generally, by providing multi-gate devices having a number of semiconductor channel layers selected based on the device type being implemented (e.g., core or SRAM device), embodiments of the present disclosure provide methods and device structures that are able to meet the diverse performance requirements of a variety of different device types simultaneously. Moreover, as described in more detail below, the various embodiments disclosed herein and including multi-gate devices with different numbers of semiconductor channel layers may be fabricated using a single, contiguous process flow. Other embodiments and advantages will be evident to those skilled in the art upon reading the present disclosure.

For purposes of the discussion that follows, FIG. 1 provides a simplified top-down layout view of a multi-gate device 100. In various embodiments, the multi-gate device 100 may include a FinFET device, a GAA transistor, or other type of multi-gate device. The multi-gate device 100 may include a plurality of fin elements 104 extending from a substrate, a gate structure 108 disposed over and around the fin elements 104, and source/drain regions 105, 107, where the source/drain regions 105, 107 are formed in, on, and/or surrounding the fins 104. A channel region of the multi-gate device 100, which may include a plurality of semiconductor channel layers (e.g., when the multi-gate device 100 includes a GAA transistor), is disposed within the fins 104, underlying the gate structure 108, along a plane substantially parallel to a plane defined by section AA' of FIG. 1. In some embodiments, sidewall spacers may also be formed on sidewalls of the gate structure 108. Various other features of the multi-gate device 100 are discussed in more detail below with reference to the methods of FIG. 2 and FIG. 12.

Figure 2:
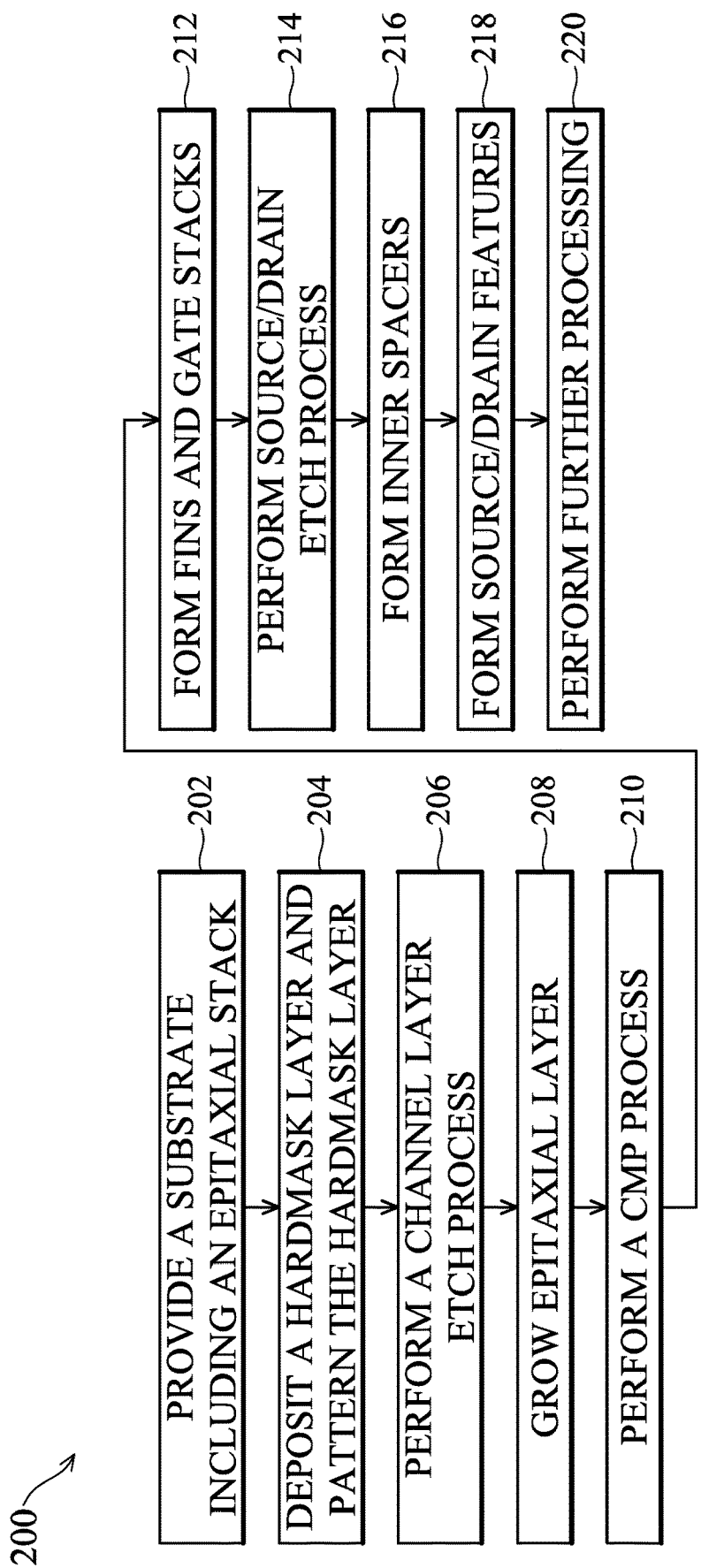
FIG. 2 is a flow chart of a method of fabricating a semiconductor device 300, according to one or more aspects of the present disclosure.
Figure 10:
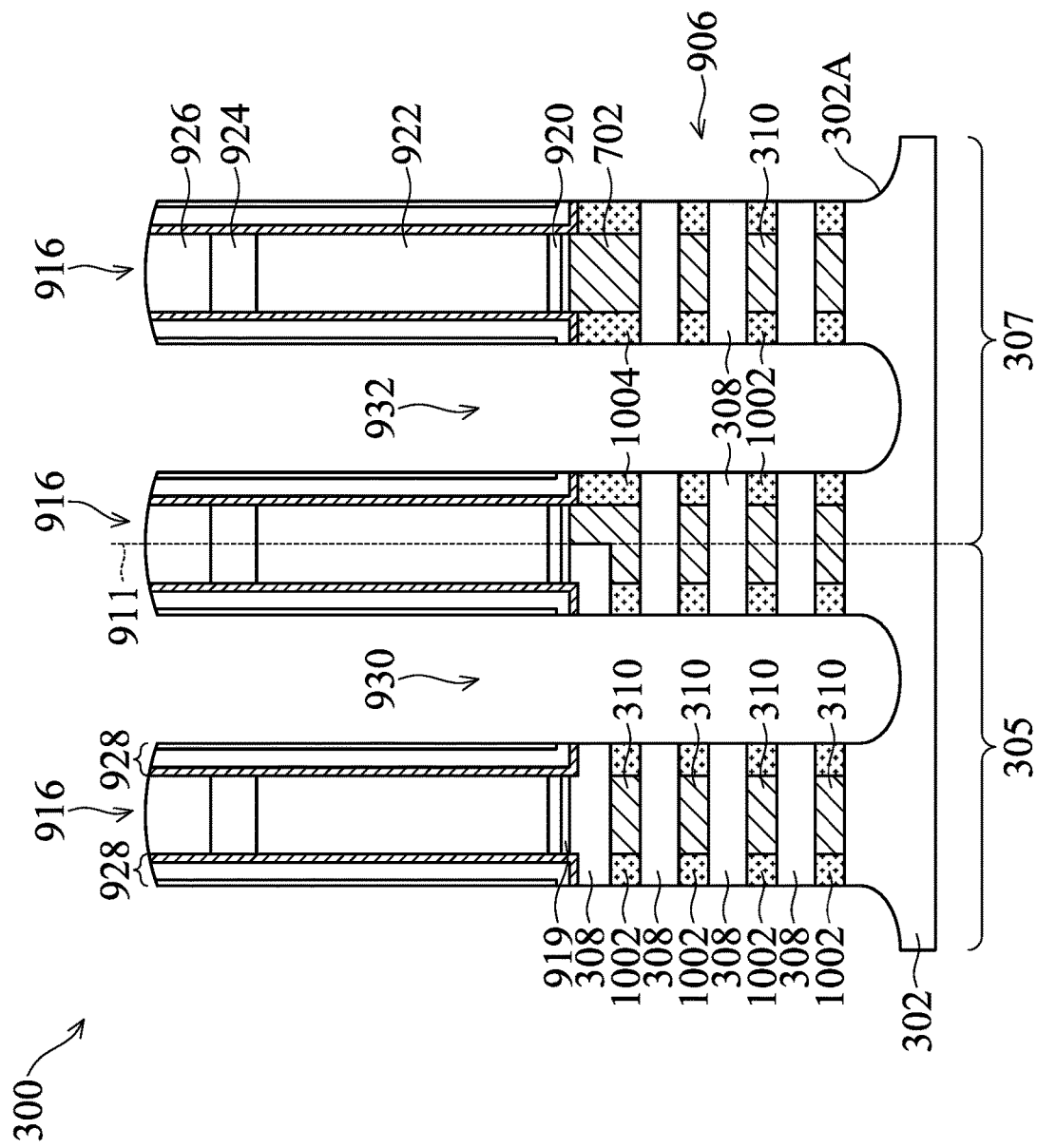
Figure 11:
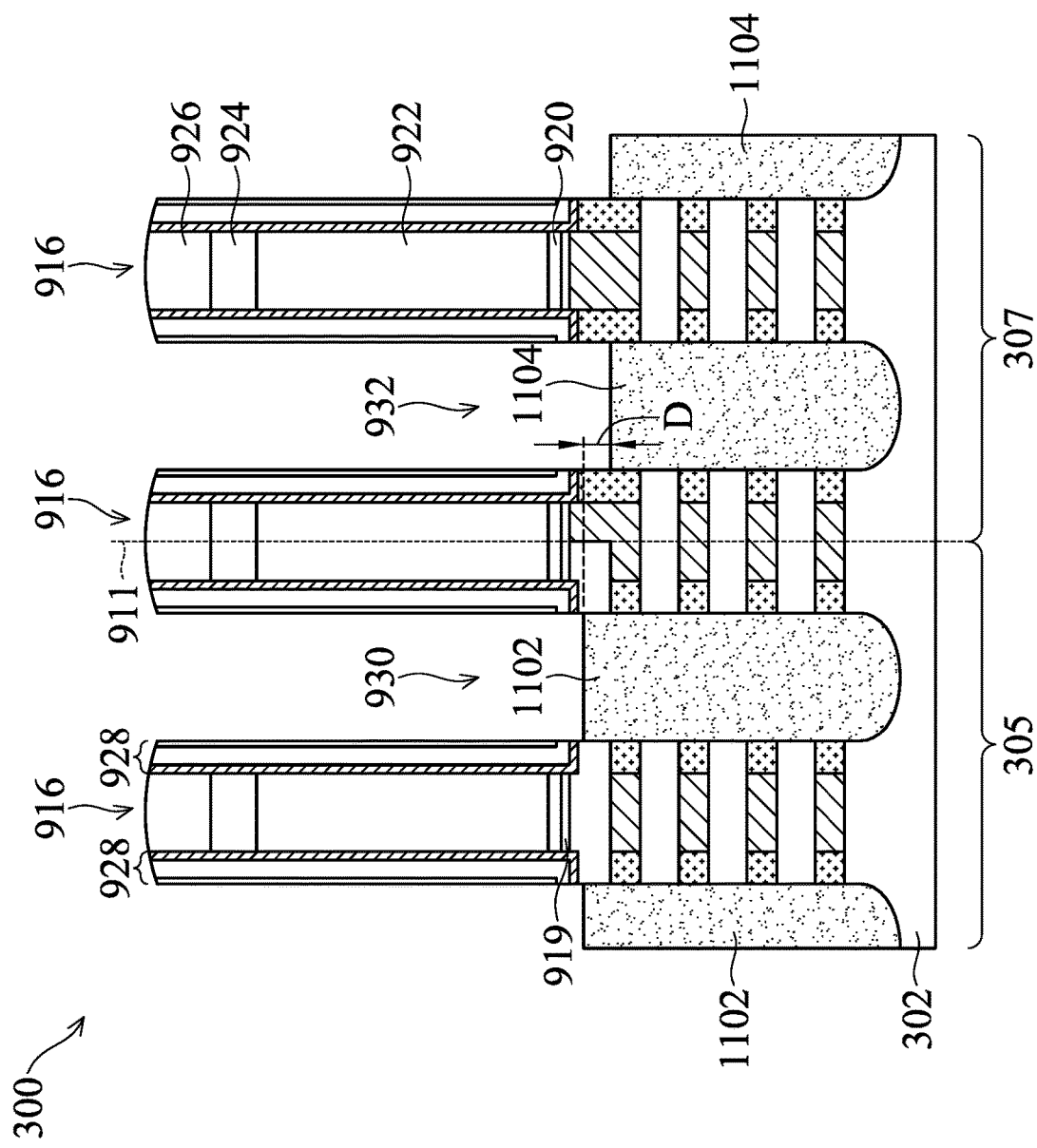
Figure 12:
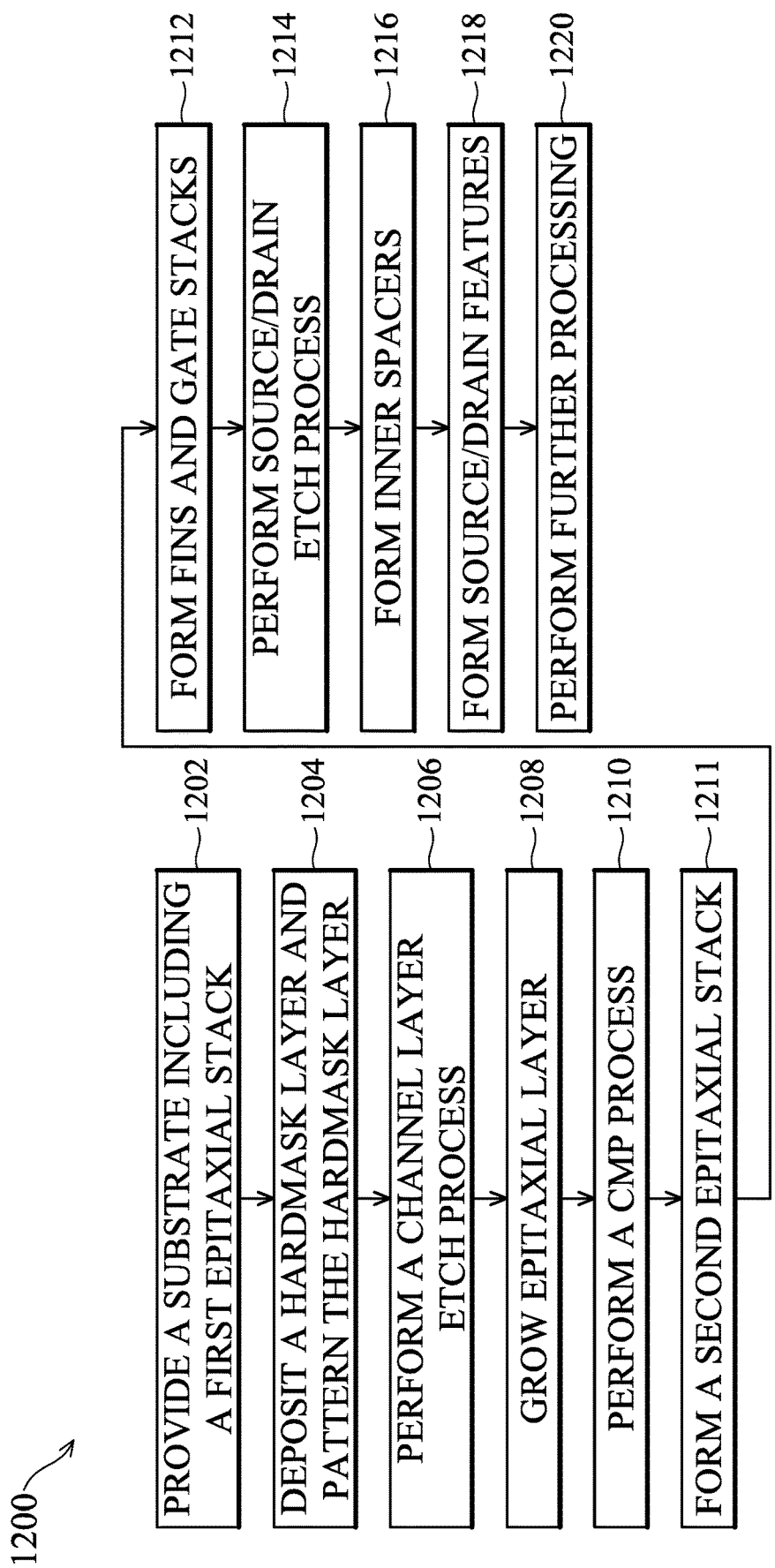
FIG. 12 is a flow chart of a method of fabricating a semiconductor device 1300, according to one or more aspects of the present disclosure.

With reference to FIGS. 2 and 12, illustrated therein is a method 200 and a method 1200 of semiconductor device fabrication including fabrication of a semiconductor device 300 and a semiconductor device 1300, respectively, having different numbers of semiconductor channel layers on a single substrate, where the number of semiconductor channel layers for a given multi-gate device is selected based on a device type being implemented, in accordance with various embodiments. The method 200 is discussed below with reference to FIGS. 3-11, where FIGS. 3-11 provide cross-sectional views of an embodiment of the semiconductor device 300 along a plane substantially parallel to a plane defined by section AA' of FIG. 1. Similarly, the method 1200 is discussed below with reference to FIGS. 13-22, where FIGS. 13-22 provide cross-sectional views of an embodiment of the semiconductor device 1300 along a plane substantially parallel to a plane defined by section AA' of FIG. 1.

The methods 200, 1200 are discussed below with reference to fabrication of GAA transistors used to implement a variety of device types including core (logic) devices and static random-access memory (SRAM) devices. However, it will be understood that aspects of the methods 200, 1200 may be equally applied to other types of multi-gate devices, or to other types of devices implemented by the multi-gate devices, without departing from the scope of the present disclosure. In some embodiments, the methods 200, 1200 may be used to fabricate the multi-gate device 100, described above with reference to FIG. 1. Thus, one or more aspects discussed above with reference to the multi-gate device 100 may also apply to the methods 200, 1200. It is understood that the methods 200, 1200 include steps having features of a complementary metal-oxide-semiconductor (CMOS) technology process flow and thus, are only described briefly herein. Also, additional steps may be performed before, after, and/or during the methods 200, 1200.

It is noted that certain aspects of the methods 200, 1200 are described as being performed in a region of the semiconductor device 300 and the semiconductor device 1300, respectively, including a particular device type (e.g., such as a core (logic) device or an SRAM device). However, if not described as being performed in a region including a particular device type, the step of the methods 200, 1200 being described may be assumed as being performed across a plurality of regions including a plurality of devices types (e.g., across a plurality of device type regions). Further, the semiconductor device 300 and the semiconductor device 1300 may include various other devices and features, such as other types of devices such as additional transistors, bipolar junction transistors, resistors, capacitors, inductors, diodes, fuses and/or other logic circuits, etc., but is simplified for a better understanding of the inventive concepts of the present disclosure. In some embodiments, the semiconductor device 300 and the semiconductor device 1300 include a plurality of semiconductor devices (e.g., transistors), including PFETs, NFETs, etc., which may be interconnected. Moreover, it is noted that the process steps of the methods 200, 1200, including any descriptions given with reference to the figures are merely exemplary and are not intended to be limiting beyond what is specifically recited in the claims that follow.

Referring first to the method 200 of FIG. 2 and, the method 200 begins at block 202 where a substrate including an epitaxial stack is provided. Referring to the example of FIG. 3, in an embodiment of block 202, a substrate 302 including an epitaxial stack of layers 304 is provided. In some embodiments, the substrate 302 may be a semiconductor substrate such as a silicon substrate. The substrate 302 may include various layers, including conductive or insulating layers formed on a semiconductor substrate. The substrate 302 may include various doping configurations depending on design requirements as is known in the art.

The substrate 302 may also include other semiconductors such as germanium, silicon carbide (SiC), silicon germanium (SiGe), or diamond. Alternatively, the substrate 302 may include a compound semiconductor and/or an alloy semiconductor. Further, the substrate 302 may optionally include an epitaxial layer (epi-layer), may be strained for performance enhancement, may include a silicon-on-insulator (SOI) structure, and/or have other suitable enhancement features. In addition, the substrate 302 may include an SRAM device region 305 and a core (logic) device region 307, where a boundary 311 is defined therebetween. In some examples, the substrate 302 includes isolation features (e.g., shallow trench isolation (STI) features) interposing the SRAM device region 305 and the core (logic) device region 307.

In a further embodiment of block 202, the epitaxial stack of layers 304, also referred to herein as the epitaxial stack 304, is formed over the substrate 302. The epitaxial stack 304 includes epitaxial layers 310 of a first composition interposed by epitaxial layers 308 of a second composition. In an embodiment, the epitaxial layers 310 of the first composition are SiGe and the epitaxial layers 308 of the second composition are silicon (Si). However, other embodiments are possible including those that provide for a first composition and a second composition having different oxidation rates and/or etch selectivity. For example, in some embodiments, either of the epitaxial layers 308, 310 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. By way of example, epitaxial growth of the epitaxial layers 308, 310 may be performed by a molecular beam epitaxy (MBE) process, a metalorganic chemical vapor deposition (MOCVD) process, and/or other suitable epitaxial growth processes. It is also noted that while the epitaxial layers 308, 310 are shown as having a particular stacking sequence, where the layer 310 is the topmost layer of epitaxial stack 304, other configurations are possible. For example, in some cases, the layer 308 may alternatively be the topmost layer of the epitaxial stack 304. Stated another way, the order of growth for the layers 308, 310, and thus their stacking sequence, may be switched or otherwise be different than what is shown in the figures, while remaining within the scope of the present disclosure.

In various embodiment, the epitaxial layers 308 or portions thereof may form a channel region of a GAA transistor of the device 300. For example, the epitaxial layers 308 may be referred to as semiconductor channel layers that are used to form a channel region of a GAA transistor. In various embodiments, the semiconductor channel layers (e.g., the epitaxial layers 308 or portions thereof) may include nanosheet channel(s), nanowire channel(s), bar-shaped channel(s), and/or other suitable channel configurations. The semiconductor channel layers are also used to form portions of the source/drain features of the GAA transistor, as discussed below.

Figure 3:
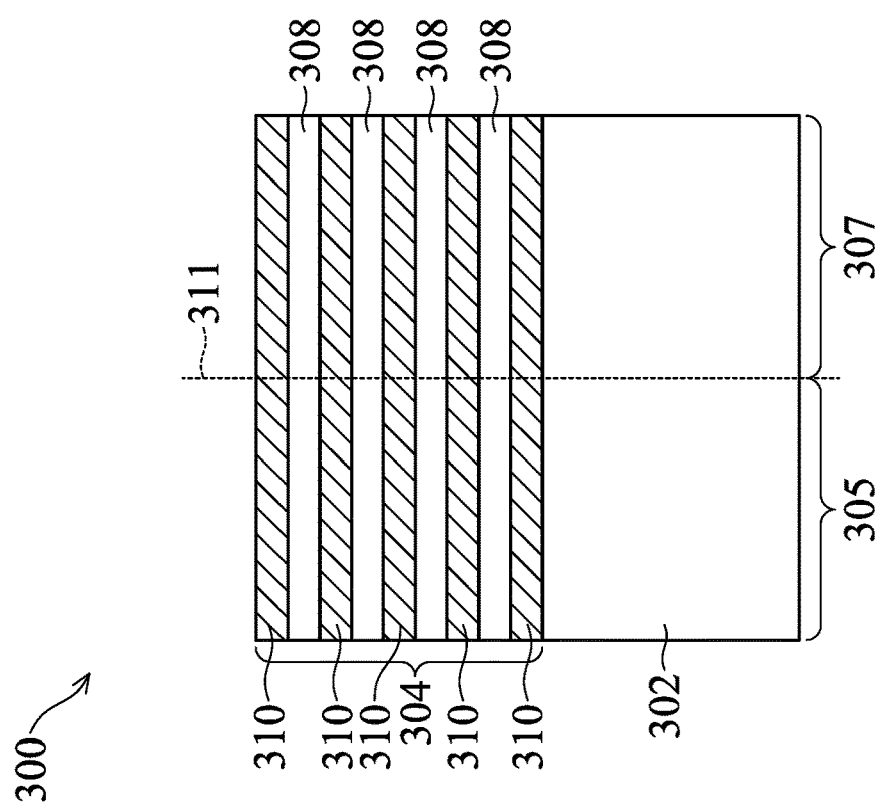

It is noted that while four (4) layers of the epitaxial layer 308 and five (5) layers of the epitaxial layer 310 are illustrated in FIG. 3, this is for illustrative purposes only and not intended to be limiting beyond what is specifically recited in the claims. It can be appreciated that any number of epitaxial layers can be formed in the epitaxial stack 304, where the number of epitaxial layers depends on the desired number of semiconductor channel layers for the GAA device. In some examples, the number of epitaxial layers 308, and thus the number of semiconductor channel layers, is selected based on the device type being implemented by the GAA transistor (e.g., such as core (logic) devices or SRAM devices, among others). In some embodiments, the number of epitaxial layers 308, and thus the number of semiconductor channel layers, is between 3 and 5.

In some embodiments, the epitaxial layers 310 each have a thickness range of about 4-8 nanometers (nm). In some cases, the epitaxial layers 308 each have a thickness range of about 4-8 nm. As noted above, the epitaxial layers 308 may serve as semiconductor channel layers for a subsequently-formed multi-gate device (e.g., a GAA transistor) and its thickness may be chosen based at least in part on device performance considerations. The epitaxial layers 310 may serve to define a gap distance between adjacent semiconductor channel layers for the subsequently-formed multi-gate device and its thickness may also be chosen based at least in part on device performance considerations.

The method 200 proceeds to block 204 where a hardmask (HM) layer is deposited over the epitaxial stack 304 and patterned to form a patterned HM layer 402. Referring to the example of FIG. 4, in an embodiment of block 204, a HM layer may be formed over the epitaxial stack 304. In some embodiments, the HM layer includes an oxide layer (e.g., such as $SiO_2$). In some embodiments, the HM layer includes an oxide layer (e.g., such as $SiO_2$) and a nitride layer (e.g., such as $Si_3N_4$) formed over the oxide layer. In some examples, the oxide layer may include thermally grown oxide, CVD-deposited oxide, and/or ALD-deposited oxide, and the nitride layer may include a nitride layer deposited by CVD or other suitable technique. By way of example, the oxide layer may have a thickness of between approximately 5 nm and approximately 40 nm. In some embodiments, the nitride layer may have a thickness of between approximately 20 nm and approximately 160 nm.

After depositing the HM layer, the HM layer is patterned. In some embodiments, a photolithography (photo) step is performed to form a patterned photoresist (resist) layer that exposes the HM layer in the core (logic) device region 307. For example, in some embodiments, performing the photo step may include forming a resist layer over the device 300, exposing the resist to a pattern (e.g., core (logic) device region mask), performing post-exposure bake processes, and developing the resist to form a patterned resist layer. In some embodiments, after formation of the patterned resist layer, an etching process is performed to etch the HM layer from the core (logic) device region 307 to form the patterned HM layer 402 which exposes the topmost epitaxial layer 310 in the core (logic) device region 307, while the SRAM device region 305 remains masked by the patterned resist layer. In some examples, the etching process may include a wet etch, a dry etch, or a combination thereof. In addition, in some embodiments, one or more different etch chemistries and/or etch processes may be used to effectively etch the HM layer. After the etching process, the resist layer may be removed, for example, by way of a solvent, resist stripper, ashing, or other suitable technique.

The method 200 proceeds to block 206 where a channel layer etch process is performed. Referring to the example of FIGS. 4-6, in an embodiment of block 206, one or more semiconductor channel layers are etched from the core (logic) device region 307. As discussed above, and in accordance with various embodiments, core (logic) devices may be implemented using a fewer number of semiconductor channel layers (epitaxial layers 308) as compared to SRAM devices. Core (logic) devices, formed within the core (logic) device region 307, may be implemented using a fewer number of semiconductor channel layers in order to reduce total device capacitance and provide increased device speed (e.g., including improved AC performance). SRAM devices, formed within the SRAM device region 305, may be implemented using a greater number of semiconductor channel layers to provide increased cell current, and to reduce variation of transistor threshold voltage and transistor current.

For purposes of this discussion, the total number of epitaxial layers 308 in the SRAM device region 305, and thus the total number of semiconductor channel layers in the SRAM device region 305, is equal to 'N'. Further, the total number of epitaxial layers 308 in the core (logic) device region 307, and thus the total number of semiconductor channel layers in the core (logic) device region 307, is equal to 'N−1' or 'N−2'. To be sure, in some examples, the total number of semiconductor channel layers in the core (logic) device region 307 may be equal to 'N−3' or 'N−4'. In a first example, with reference to FIGS. 4 and 5 and while the patterned HM layer 402 masks the SRAM device region 305, an etching process is performed to etch the topmost epitaxial layer 308 of the epitaxial stack 304 within the core (logic) device region 307. More specifically, in some embodiments and while the patterned HM layer 402 masks the SRAM device region 305, the etching process may etch the exposed topmost epitaxial layer 310 in the core (logic) device region 307, the topmost epitaxial layer 308 in the core (logic) device region 307 that is disposed beneath the topmost epitaxial layer 310, and the second topmost epitaxial layer 310 in the core (logic) device region 307 that is disposed beneath the topmost epitaxial layer 308 to form a trench 502 in the core (logic) device region 307. In some examples, the etching process may include a wet etch, a dry etch, or a combination thereof. In addition, in some embodiments, one or more different etch chemistries and/or etch processes may be used to effectively etch each of the epitaxial layers 308, 310 of the epitaxial stack 304 in the core (logic) device region 307. In some examples, the etching process may proceed until the second topmost epitaxial layer 308 in the core (logic) device region 307 is exposed, as shown in the example of FIG. 5. As a result of the channel layer etch process described with reference to FIGS. 4 and 5, the total number of epitaxial layers 308 in the SRAM device region 305 'N' is equal to four (4), and the total number of epitaxial layers 308 in the core (logic) device region 307 is equal to 'N−1', which is three (3).

Figure 4:
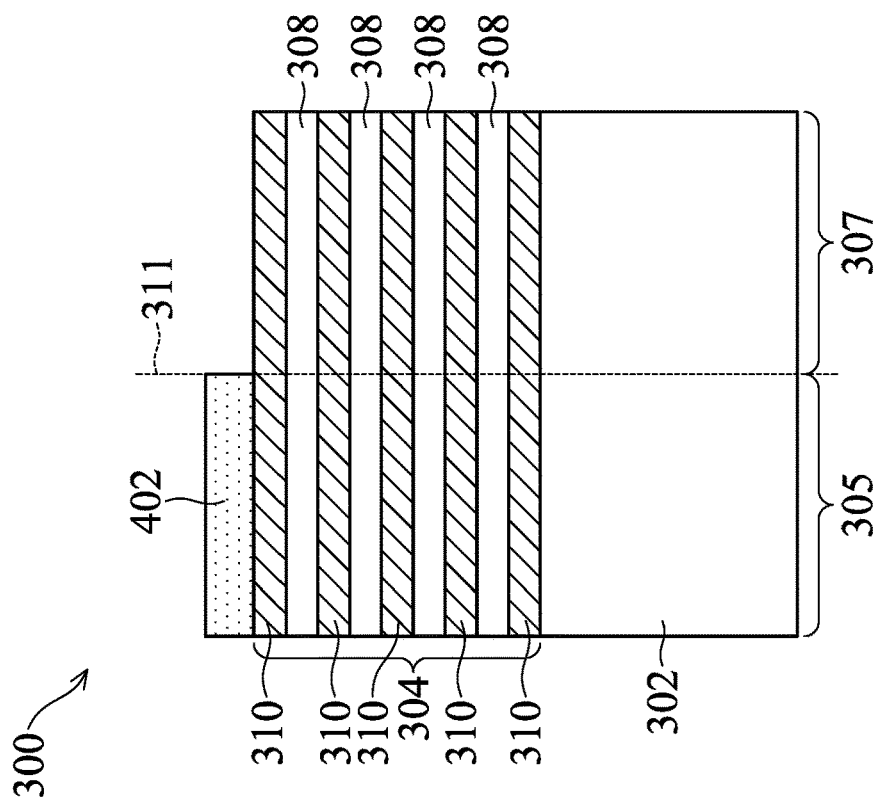
Figure 6:
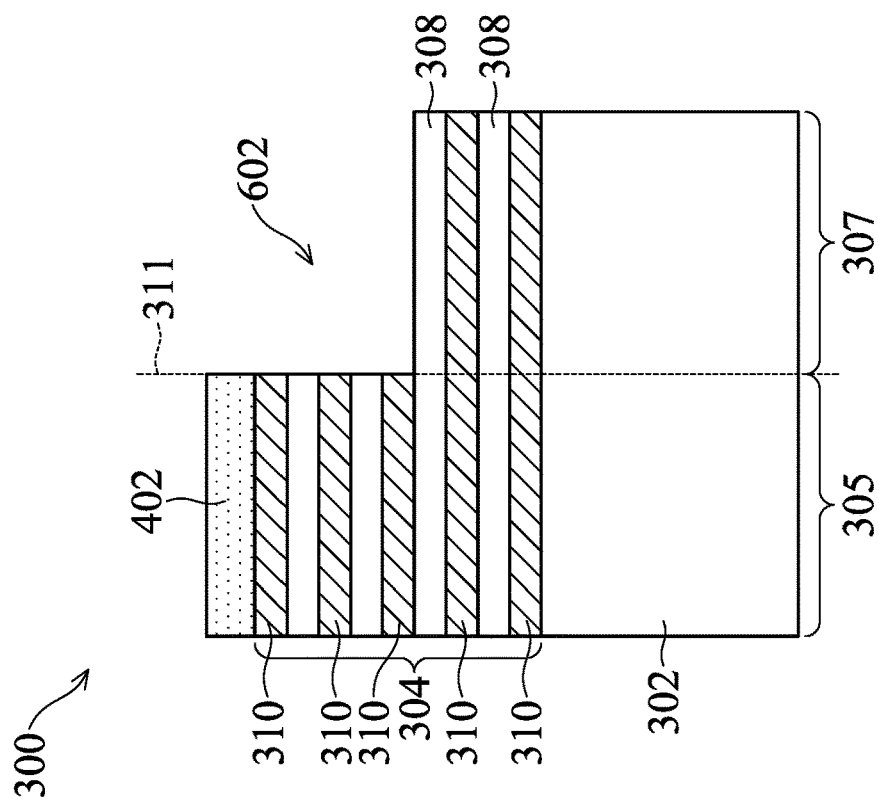
Figure 5:
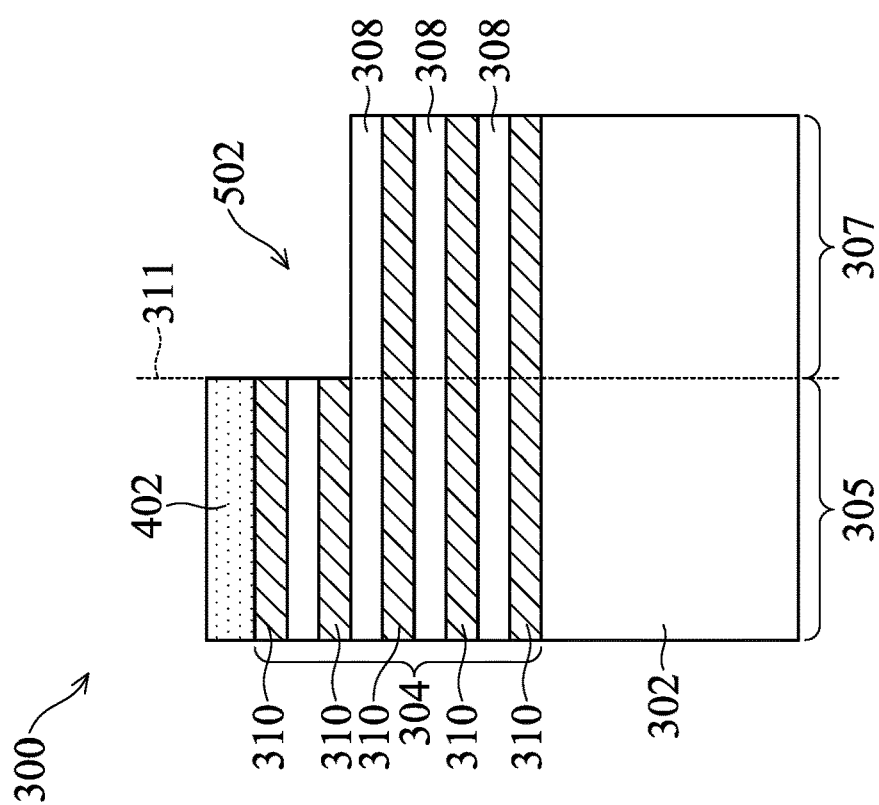

In a second example, with reference to FIGS. 4 and 6 and while the patterned HM layer 402 masks the SRAM device region 305, an etching process is performed to etch the top two (2) epitaxial layers 308 of the epitaxial stack 304 within the core (logic) device region 307. More specifically, in some embodiments and while the patterned HM layer 402 masks the SRAM device region 305, the etching process may etch the exposed topmost epitaxial layer 310 in the core (logic) device region 307, the topmost epitaxial layer 308 in the core (logic) device region 307 that is disposed beneath the topmost epitaxial layer 310, the second topmost epitaxial layer 310 in the core (logic) device region 307 that is disposed beneath the topmost epitaxial layer 308, the second topmost epitaxial layer 308 in the core (logic) device region 307 that is disposed beneath the second topmost epitaxial layer 310, and the third topmost epitaxial layer 310 in the core (logic) device region 307 that is disposed beneath the second topmost epitaxial layer 308 to form a trench 602 in the core (logic) device region 307. It is noted that a depth of the trenches formed by the channel layer etch process varies as a function of how many epitaxial layers 308 (and epitaxial layers 310) are etched from the core (logic) device region 307. Thus, the trench 602 of FIG. 6 has a greater depth than the trench 502 of FIG. 5. In some examples, the etching process may include a wet etch, a dry etch, or a combination thereof. In addition, in some embodiments, one or more different etch chemistries and/or etch processes may be used to effectively etch each of the epitaxial layers 308, 310 of the epitaxial stack 304 in the core (logic) device region 307. In some examples, the etching process may proceed until the third topmost epitaxial layer 308 in the core (logic) device region 307 is exposed, as shown in the example of FIG. 6. As a result of the channel layer etch process described with reference to FIGS. 4 and 6, the total number of epitaxial layers 308 in the SRAM device region 305 'N' is equal to four (4), and the total number of epitaxial layers 308 in the core (logic) device region 307 is equal to 'N−2', which is two (2).

For purposes of the discussion that follows, it is assumed that one (1) semiconductor channel layer is etched from the core (logic) device region 307, as described above with reference to FIGS. 4 and 5. Thus, for the remainder of the discussion of the method 200, the total number of epitaxial layers 308 in the SRAM device region 305 'N' is equal to four (4), and the total number of epitaxial layers 308 in the core (logic) device region 307 is equal to 'N−1', which is three (3).

After the channel layer etch process (block 206), the method 200 proceeds to block 208 where an epitaxial layer is grown within the core (logic) device region 307. Referring to the example of FIGS. 5 and 7, in an embodiment of block 208, an epitaxial layer 702 is formed over the substrate 302 and within the trench 502 of the core (logic) device region 307. In some embodiments, the epitaxial layer 702 is composed of the same composition as the epitaxial layers 310. Thus, in some cases, the epitaxial layer 702 includes SiGe; however, other embodiments are possible. Like the epitaxial layers 310, the epitaxial layer 702 may, in some embodiments, include other materials such as germanium, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof. Further, similar to layers of the epitaxial stack 304, epitaxial growth of the epitaxial layer 702 may be performed by an MBE process, an MOCVD process, and/or other suitable epitaxial growth processes.

The method 200 proceeds to block 210 where a chemical mechanical polishing (CMP) process is performed. With reference to the example of FIGS. 7 and 8, in an embodiment of block 210, a CMP process is performed. In some embodiments, the CMP process removes the HM layer 402 from the SRAM device region 305 and planarizes a top surface of the device 300. In some cases, a top portion of the epitaxial layer 702 may also be removed from the core (logic) device region 307 during the CMP process, thereby reducing a thickness of the epitaxial layer 702. In some embodiments, the topmost epitaxial layer 310 within the SRAM device region 305 may also be removed during the CMP process to expose the topmost epitaxial layer 308 within the SRAM device region 305. In some cases, after the CMP process of block 210, a top surface of the topmost epitaxial layer 308 within the SRAM device region 305 is substantially level with a top surface of the epitaxial layer 702 within the core (logic) device region 307.

Figure 9:
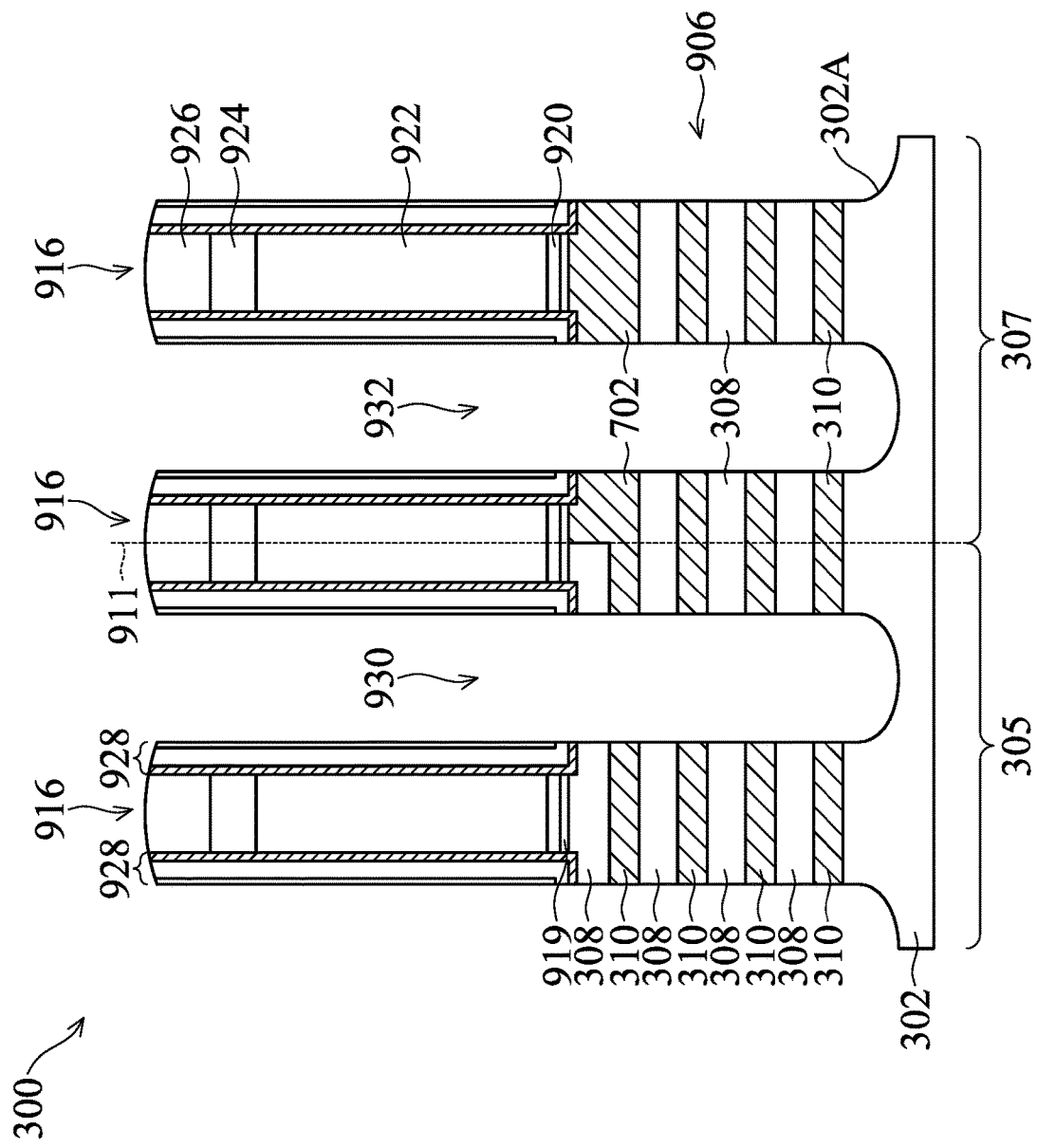

The method 200 then proceeds to block 212 where fins and gate stacks are formed. With reference to FIGS. 8 and 9, in an embodiment of block 212, a plurality of fins, such as a fin 906, are formed. In some embodiments, the fin 906 includes a substrate portion 302A (formed from the substrate 302), as well as portions of the epitaxial layers 308, 310. In addition, portions of the fin 906 disposed within the core (logic) device region 307 further include the epitaxial layer 702, described above. In some cases, shallow trench isolation (STI) features may be formed to isolate the fin 906 from neighboring fins.

The plurality of fins, including the fin 906, may be fabricated using suitable processes including photolithography and etch processes. The photolithography process may include forming a photoresist layer over the semiconductor device 300, exposing the resist to a pattern, performing post-exposure bake processes, and developing the resist to form a masking element including the resist. In some embodiments, pattering the resist to form the masking element may be performed using an electron beam (e-beam) lithography process. The masking element may then be used to protect regions of the substrate 302, and layers formed thereupon, while an etch process (i) forms trenches in unprotected regions through the epitaxial layers 308, 310 and into the substrate 302, in the SRAM device region 305, and (ii) forms trenches in unprotected regions through the epitaxial layers 702, 308, 310 and into the substrate 302, in the core (logic) device region 307. The trenches may be etched using a dry etch (e.g., reactive ion etching), a wet etch, and/or other suitable processes. In various embodiments, the trenches may be filled with a dielectric material forming, for example, STI features interposing the fins.

In a further embodiment of block 212, gate stacks 916 are formed over the fin 906. In an embodiment, the gate stacks 916 are dummy (sacrificial) gate stacks that are subsequently removed and replaced by the final gate stack at a subsequent processing stage of the device 300. For example, the gate stacks 916 may be replaced at a later processing stage by a high-K dielectric layer (HK) and metal gate electrode (MG). While the present discussion is directed to a replacement gate (gate-last) process whereby a dummy gate structure is formed and subsequently replaced, other configurations may be possible (e.g., such as a gate-first process). The portion of the fin 906 underlying the gate stacks 916 may be referred to as the channel region of the device 300, where the channel region includes a total number of epitaxial layers 308 (semiconductor channel layers) according to the device type being implemented. In the SRAM device region 305, the portion of the fin 906 underlying the gate stack 916 includes four (4) epitaxial layers 308 ('N' semiconductor channel layers). In the core (logic) device region 307, the portion of the fin 906 underlying the gate stack 916 includes three (3) epitaxial layers 308 ('N–1' semiconductor channel layers). In some cases, as shown in FIG. 9, there may also be a gate stack 916 formed at the boundary 311 between the SRAM device region 305 and the core (logic) device region 307. In some examples, the portion of the fin 906 underlying the gate stack 916 at the boundary 311 includes four (4) epitaxial layers 308 on a first side of the boundary 311 and three (3) epitaxial layers 308 on a second side of the boundary 311. The gate stacks 916 may also define a source/drain region of the fin 906, for example, the regions of the fin 906 adjacent to and on opposing sides of the channel region.

In some embodiments, the gate stacks 916 include a dielectric layer 920 and an electrode layer 922. The gate stacks 916 may also include one or more hard mask layers 924, 926. In some embodiments, the hard mask layer 924 may include an oxide layer, and the hard mask layer 926 may include a nitride layer. In some embodiments, the dielectric layer 920 includes silicon oxide. Alternatively, or additionally, the dielectric layer 920 may include silicon nitride, a high-K dielectric material or other suitable material. In some embodiments, the electrode layer 922 may include polycrystalline silicon (polysilicon). In some embodiments, the oxide of the hard mask layer 924 includes a pad oxide layer that may include $SiO_2$. In some embodiments, the nitride of the hard mask layer 926 includes a pad nitride layer that may include $Si_3N_4$, silicon oxynitride or silicon carbide. In some examples, an optional sacrificial layer 919 may be formed directly beneath the dielectric layer 920. The optional sacrificial layer 919 may include SiGe, Ge, or other appropriate material, and may be used in some cases to prevent nanosheet loss (e.g., such as loss of material from the epitaxial layers 308, 310) during previous processing steps.

In some embodiments, one or more spacer layers 928 may be formed on sidewalls of the gate stacks 916. In some cases, the one or more spacer layers 928 may include a dielectric material such as silicon oxide, silicon nitride, silicon carbide, silicon oxynitride, SiCN, silicon oxycarbide, SiOCN, a low-K material (e.g., with a dielectric constant 'k'<7), and/or combinations thereof. In some embodiments, the one or more spacer layers 928 include multiple layers, such as main spacer layers, liner layers, and the like.

The method 200 then proceeds to block 214 where a source/drain etch process is performed. Still with reference to FIG. 9, in an embodiment of block 214, a source/drain etch process is performed to the device 300. In some embodiments, the source/drain etch process is performed to remove the exposed epitaxial layers 308, 310 in source/drain regions of SRAM device region 305, and to remove the exposed epitaxial layers 702, 308, 310 in source/drain regions of the core (logic) device region 307, to form trenches 930, 932 which expose underlying portions of the substrate 302. The source/drain etch process also serves to expose lateral surfaces of the epitaxial layers 308, 310 in the SRAM device region 305 and to expose lateral surfaces of the epitaxial layers 702, 308, 310 in the core (logic) device region 307, as shown in FIG. 9. In some embodiments, the source/drain etch process may also remove portions of the one or more spacer layers 928 (e.g., from top surfaces of the gate stacks 916). In some embodiments, the source/drain etch process may include a dry etching process, a wet etching process, and/or a combination thereof.

The method 200 then proceeds to block 216 where inner spacers are formed. Referring to FIG. 9 and FIG. 10, in an embodiment of block 216, a dummy layer recess process is initially performed to the device 300. The dummy layer recess process includes a lateral etch of the epitaxial layers 310 in the SRAM device region 305 and a lateral etch of the epitaxial layers 310, 702 in the core (logic) device region 307 to form recesses along sidewalls of the trenches 930, 932. In some embodiments, the dummy layer recess process is performed using a dry etching process, a wet etching process, and/or a combination thereof. In some cases, the dummy layer recess process may include etching using a standard clean 1 (SC-1) solution, ozone ($O_3$), a solution of ammonium hydroxide ($NH_4OH$), hydrogen peroxide ($H_2O_2$) and water ($H_2O$), hydrofluoric acid (HF), buffered HF, and/or a fluorine ($F_2$)-based etch. In some examples, the $F_2$-based etch may include an $F_2$ remote plasma etch. As a result of the dummy layer recess process, exposed lateral surfaces of the recessed epitaxial layers (the dummy layers) may define concave, convex, or substantially vertical profiles along opposing lateral surfaces of the recessed epitaxial layers. During a later stage of processing, as discussed below, the epitaxial layers 310 in the SRAM device region 305, and the epitaxial layers 310, 702 in the core (logic) device region 307, will be removed and replaced by a portion of a gate structure (e.g., a metal gate structure) such that the replacement gate structure defines the concave, convex, or substantially vertical profiles. In various examples, the replacement gate structure will interface an inner spacer, as also described in more detail below.

In a further embodiment of block 216, an inner spacer material is deposited over the device 300 and within the trenches 930, 932. The inner spacer material is also deposited within the recesses formed along sidewalls of the trenches 930, 932 during the dummy layer recess process. In some embodiments, the inner spacer material may include amorphous silicon. In some examples, the inner spacer material may include a dielectric material such as silicon oxide, silicon nitride, silicon carbide, silicon oxynitride, SiCN, silicon oxycarbide, SiOCN, a low-K material (e.g., with a dielectric constant 'k'<7), and/or combinations thereof. By way of example, the inner spacer material may be formed by conformally depositing the inner spacer material over the device 300 using processes such as a CVD process, a subatmospheric CVD (SACVD) process, a flowable CVD process, an ALD process, a PVD process, or other suitable process.

In a further embodiment of block 216, an inner spacer etch-back process (trim process) may be performed to the device 300. In various examples, the inner spacer etch-back process etches (trims) the previously deposited inner spacer material from over the device 300 and along sidewalls of the trenches 930, 932, while the inner spacer material remains at least partially disposed within the recesses disposed along the sidewalls of the trenches 930, 932, thereby providing inner spacers 1002 in the SRAM device region 305 and inner spacers 1002, 1004 in the core (logic) device region 307. By way of example, the inner spacer etch-back process may be performed using a wet etch process, a dry etch process, or a combination thereof. In some embodiments, the inner spacer etch-back (trim) process may include cycles of a high temperature sulfuric peroxide mixture (HTSPM) and dilute hydrofluoric acid (dHF), ozone ($O_3$) and dHF, or a combination thereof. In some cases, any residual portions of the inner spacer material that remain on top surfaces of the device 300 and/or on sidewalls or bottom surfaces of the trenches 930, 932, for example after the inner spacer etch-back process, may be removed during a subsequent clean process (e.g., prior to epitaxial growth of source/drain features). In various examples, the inner spacer material (e.g., that remains disposed within the recesses and defines the inner spacers 1002 in the SRAM device region 305 and the inner spacers 1002, 1004 in the core (logic) device region 307) may be disposed at least partially beneath the one or more spacer layers 928 (formed on sidewalls of the gate stacks 916) while abutting subsequently formed source/drain features, as described below.

The method 200 then proceeds to block 218 where source/drain features are formed. Referring to FIGS. 10 and 11, in an embodiment of block 218, source/drain features 1102 are formed in the trench 930 within the SRAM device region 305, and source/drain features 1104 are formed in the trench 932 within the core (logic) device region 307, over the exposed portions of the substrate 302. The source/drain features 1102, 1104 are formed in source/drain regions adjacent to and on either side of the gate stacks 916 of the device 300. In some embodiments, the source/drain features 1102 are in contact with the adjacent inner spacers 1002 and the semiconductor channel layers (the epitaxial layers 308) within the SRAM device region 305. In some examples, the source/drain features 1104 are in contact with the adjacent inner spacers 1002, 1004 and the semiconductor channel layers (the epitaxial layers 308) within the core (logic) device region 307.

In some embodiments, the source/drain features 1102, 1104 are formed by epitaxially growing a semiconductor material layer in the source/drain regions. The epitaxial growth of the source/drain features 1102 may occur simultaneously with the epitaxial growth of the source/drain features 1104 (e.g., using a single epitaxial growth process). Alternatively, in some cases, the source/drain features 1102 and the source/drain features 1104 may be formed using separate epitaxial growth processes (e.g., a first process for the SRAM device region 305 and a second process for the core (logic) device region 307). Regardless of whether they are formed simultaneously or separately, it is noted that a top surface of the source/drain features 1102 are offset by a distance 'D' from a top surface of the source/drain features 1104. Stated another way, the top surface of the source/drain features 1102 define a first horizontal plane that is disposed above a second horizontal plane defined by the top surface of the source/drain features 1104.

Generally, the offset between the source/drain features 1102, 1104 is due to the semiconductor channel layer that has been etched from the core (logic) device region 307. In some embodiments, the source/drain features 1102, 1104 may selectively grow over the exposed portions of the substrate 302 and on exposed surfaces of the epitaxial layers 308 (the semiconductor channel layers), while not completely forming along exposed surfaces of the inner spacers 1002, 1004 because the inner spacers 1002, 1004 include a dielectric layer. In particular, since the topmost epitaxial layer 308 within the core (logic) device region 307 is lower than the topmost epitaxial layer 308 within the SRAM device region 305, the source/drain features 1104 will tend to form to a lower height than the source/drain features 1102. In other words, the source/drain features 1104 have fewer epitaxial layers 308, and lower topmost epitaxial layers 308, on which to selectively grow as compared to the source/drain features 1102.

In some embodiments, a clean process may be performed immediately prior to formation of the source/drain features 1102, 1104. The clean process may include a wet etch, a dry etch, or a combination thereof. In addition, the clean process may remove any residual portions of the inner spacer material that remained on top surfaces of the device 300 and/or on sidewalls or bottom surfaces of the trenches 930, 932 (e.g., after the inner spacer etch-back process).

In various embodiments, the semiconductor material layer grown to form the source/drain features 1102, 1104 may include Ge, Si, GaAs, AlGaAs, SiGe, GaAsP, SiP, or other suitable material. The source/drain features 1102, 1104 may be formed by one or more epitaxial (epi) processes. In some embodiments, the source/drain features 1102, 1104 may be in-situ doped during the epi process. For example, in some embodiments, epitaxially grown SiGe source/drain features may be doped with boron. In some cases, epitaxially grown Si epi source/drain features may be doped with carbon to form Si:C source/drain features, phosphorous to form Si:P source/drain features, or both carbon and phosphorous to form SiCP source/drain features. In some embodiments, the source/drain features 1102, 1104 are not in-situ doped, and instead an implantation process is performed to dope the source/drain features 1102, 1104.

The method 200 then proceeds to block 220 where further processing is performed to the device 300. For example, after formation of the source/drain features 1102, 1104 (block 218), a contact etch stop layer (CESL) and an inter-layer dielectric (ILD) layer are formed over the device 300 and a chemical mechanical polishing (CMP) process is performed. In some embodiments, the CMP process may expose a top surface of the gate stacks 916 (e.g., by removing portions of the ILD layer and CESL) overlying the gate stacks 916 and planarize a top surface of the device 300. In addition, the CMP process may remove the hard mask layers 924, 926 overlying the gate stacks 916 to expose the underlying electrode layer 922, such as a polysilicon electrode layer, of the dummy gate.

In a further embodiment of block 220, the exposed electrode layer 922 of the gate stacks 916 may initially be removed by suitable etching processes, followed by an etching process to remove the dielectric layer 920, and the optional sacrificial layer 919 (if included), from the gate stacks 916. In some examples, the etching processes may include a wet etch, a dry etch, or a combination thereof.

After removal of the dummy gates, and in a further embodiment of block 220, the epitaxial layers 310 (dummy layers) in the channel region of the SRAM device region 305 are selectively removed (e.g., using a selective etching process), while the 'N' semiconductor channel layers (epitaxial layers 308) remain unetched, and the epitaxial layers 310, 702 (dummy layers) in the channel region of the core (logic) device region 307 are selectively removed (e.g., using a selective etching process), while the 'N–1' semiconductor channel layers (epitaxial layers 308) remain unetched. In some examples, selective removal of the dummy layers may be referred to as a channel layer release process (e.g., as the semiconductor channel layers are released from the dummy layers). As a result of the selective removal of the dummy layers, gaps are formed between the adjacent epitaxial layers 308, with the inner spacers 1002 disposed on opposing lateral ends of the gaps in the SRAM device region 305, and with the inner spacers 1002, 1004 disposed on opposing lateral ends of the gaps in the core (logic) device region 307.

After selective removal of the dummy layers, and in a further embodiment of block 220, a gate structure is formed. The gate structure may include a high-K/metal gate stack, however other compositions are possible. In some embodiments, the gate structure may form the gate associated with the multi-channels provided by the plurality of exposed semiconductor channel layers (the exposed epitaxial layers 308) in each of the SRAM device region 305 and the core (logic) device region 307. In some embodiments, the gate structure includes an interfacial layer (IL) (e.g., such as silicon oxide ($SiO_2$), HfSiO, or silicon oxynitride) disposed on exposed surfaces of the epitaxial layers 308, and a high-K dielectric layer formed over the IL. In some embodiments, the high-K dielectric layer may include hafnium oxide ($HfO_2$). Alternatively, the high-K dielectric layer may include $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. In some examples, the high-K dielectric layer may also be formed on exposed surfaces of the inner spacers 1002 or 1002, 1004 on opposing lateral ends of the gaps. In various embodiments, the IL and the high-K dielectric layer collectively define a gate dielectric of the gate structure for the device 300.

In a further embodiment of block 220, a metal gate including a metal layer is formed over the gate dielectric (e.g., over the IL and the high-K dielectric layer). The metal layer may include a metal, metal alloy, or metal silicide. In various examples, the metal layer may include Ti, Ag, Al, TiAlN, TaC, TaCN, TaSiN, Mn, Zr, TiN, TaN, Ru, Mo, Al, WN, Cu, W, Re, Jr, Co, Ni, other suitable metal materials or a combination thereof. Additionally, the formation of the gate dielectric/metal gate stack may include depositions to form various gate materials, one or more liner layers, and one or more CMP processes to remove excessive gate materials and thereby planarize a top surface of the device 300. In various embodiments, the formed gate structure includes portions that interpose each of the epitaxial layers 308, which each provide semiconductor channel layers for the device 300.

Generally, the semiconductor device 300 may undergo further processing to form various features and regions known in the art. For example, further processing may form various contacts/vias/lines and multilayer interconnect features (e.g., metal layers and interlayer dielectrics) on the substrate 302, configured to connect the various features to form a functional circuit that may include one or more multi-gate devices (e.g., one or more GAA transistors). In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 200, and some process steps described above may be modified, replaced, or eliminated in accordance with various embodiments of the method 200. It is also noted that while the method 200 has been described with reference the SRAM device region 305 and the core (logic) device region 307, it will be understood that aspects of the method 200 may equally apply to fabrication of other device types formed in other device regions (e.g., such as analog devices).

Referring now to the method 1200 of FIG. 12, the method 1200 is similar to the method 200, discussed above, however the method 1200 includes an alternative technique for providing the 'N' epitaxial layers 308 in the SRAM device region 305, and the 'N–1' or 'N–2' epitaxial layers in the core (logic) device region 307. For clarity of discussion, aspects of the method 1200 that are the same as those of the method 200 may only be briefly discussed, while additional discussion is reserved for those features of the method 1200 that are different from those of the method 200.

The method 1200 begins at block 1202 where a substrate including a first epitaxial stack is provided. Referring to the example of FIG. 13 and FIG. 14, and in two alternative embodiments of block 1202, a substrate 1302 including a first epitaxial stack of layers 1304-1 is provided. In various embodiments, the substrate 1302 may be substantially the same as the substrate 302, described above. In addition, the substrate 1302 may include an SRAM device region 1305 and a core (logic) device region 1307, where a boundary 1311 is defined therebetween. In some examples, the SRAM device region 1305 and the core (logic) device region 1307 may be substantially the same as the SRAM device region 305 and the core (logic) device region 307, respectively, as discussed above.

The first epitaxial stack 1304-1 is formed over the substrate 1302, and the first epitaxial stack 1304-1 includes epitaxial layers 1310 of a first composition interposed by epitaxial layers 1308 of a second composition. In an embodiment, the epitaxial layers 1310 of the first composition are SiGe and the epitaxial layers 1308 of the second composition are silicon (Si). More generally, and in various embodiments, the epitaxial layers 1310 and the epitaxial layers 1308 may be substantially the same as the epitaxial layers 310 and the epitaxial layers 308, respectively, as discussed above. Like the epitaxial layers 308, the epitaxial layers 1308 or portions thereof may form a channel region of a GAA transistor of the device 1300.

Figures 13, 14:
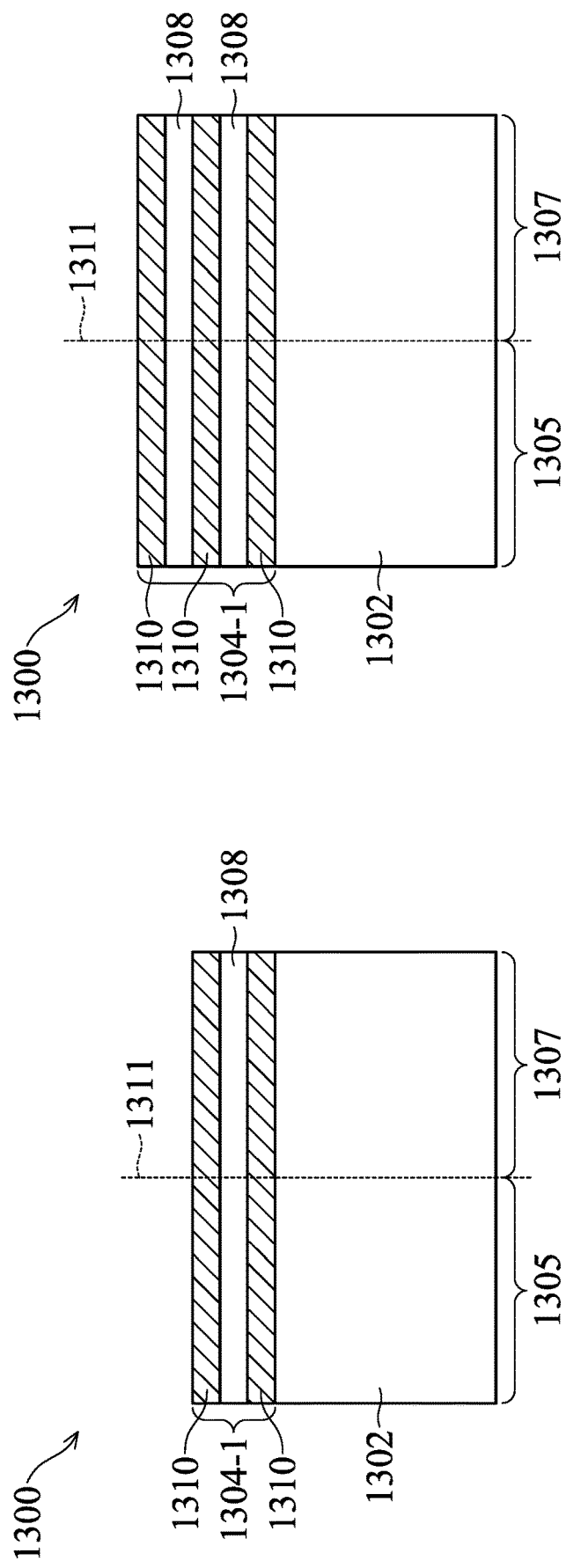
FIGS. 13, 14, 15, 16, 17, 18, 19, 20, 21, and 22 provide cross-sectional views of an embodiment of the semiconductor device 1300 along a plane substantially parallel to a plane defined by section AA' of FIG. 1, in accordance with some embodiments.

In the example of FIG. 13, the first epitaxial stack 1304-1 includes one (1) epitaxial layer 1308 (interposing two epitaxial layers 1310), while in the example of FIG. 14, the first epitaxial stack 1304-1 includes two (2) epitaxial layers 1308 (interposing three epitaxial layers 1310). In the method 200, discussed above, the epitaxial stack 304 was formed and then one or more epitaxial layers 308 were etched from the core (logic) device region 307 to provide the 'N' channel layers in the SRAM device region 305 and the 'N−1' or 'N−2' channel layers in the core (logic) device region 307. In contrast, in the method 1200, the number of epitaxial layers 1308 (semiconductor channel layers) formed in the first epitaxial stack 1304-1 will define how many epitaxial layers 1308 will be etched from the core (logic) device region 1307 to provide the 'N' channel layers in the SRAM device region 1305 and the 'N−1' or 'N−2' channel layers in the core (logic) device region 1307, as discussed below. Thus, in the embodiment of block 1202 illustrated in FIG. 13, one (1) epitaxial layer 1308 will be etched from the core (logic) device region 1307 to provide 'N−1' semiconductor channel layers in the core (logic) device region 1307, and in the embodiment of block 1202 illustrated in FIG. 14, two (2) epitaxial layers 1308 will be etched from the core (logic) device region 1307 to provide 'N−2' semiconductor channel layers in the core (logic) device region 1307.

Moreover, as discussed in more detail below, the epitaxial layers 1308 formed as part of the first epitaxial stack 1304-1 are themselves the layers that will be etched from the core (logic) device region 1307. In other words, instead of etching one or two epitaxial layers 308 (semiconductor channel layers) from the top of the epitaxial stack 304 as described above in the method 200, the method 1200 provides for etching the first one or two epitaxial layers formed over the substrate 1302 (as part of the first epitaxial stack 1304-1), while a second epitaxial stack 1304-2 is subsequently formed over the first epitaxial stack 1304-1 such that the topmost epitaxial layer 1308 within the SRAM device region 1305 will be substantially level with the topmost epitaxial layer 1308 within the core (logic) device region 1307, simplifying subsequent device processing. For instance, top surfaces of source/drain features within each of the SRAM device region 1305 and the core (logic) device region 1307 will also be substantially level with each other, as described below.

For purposes of the discussion that follows, it is assumed that the first epitaxial stack 1304-1 includes one (1) epitaxial layer 1308 (such that one (1) semiconductor channel layer will be etched from the core (logic) device region 1307), in accordance with the example of FIG. 13, discussed above. Thus, for the remainder of the discussion of the method 1200, it is assumed that there will be 'N−1' semiconductor channel layers in the core (logic) device region 1307.

The method 1200 proceeds to block 1204 where a hardmask (HM) layer is deposited over the first epitaxial stack 1304-1 and patterned to form a patterned HM layer 1402. Referring to the example of FIG. 13 and FIG. 15, in an embodiment of block 1204, a HM layer may be formed over the epitaxial stack 304. In some embodiments, the HM layer (and the patterning thereof) used to form the patterned HM layer 1402 may be substantially the same as the HM layer deposition and patterning used to form the patterned HM layer 402, described above. In various examples, the patterned HM layer 1402 thus exposes the topmost epitaxial layer 1310 of the first epitaxial stack 1304-1 in the core (logic) device region 1307, while the SRAM device region 1305 remains masked by the patterned HM layer 1402.

Figures 15, 16:
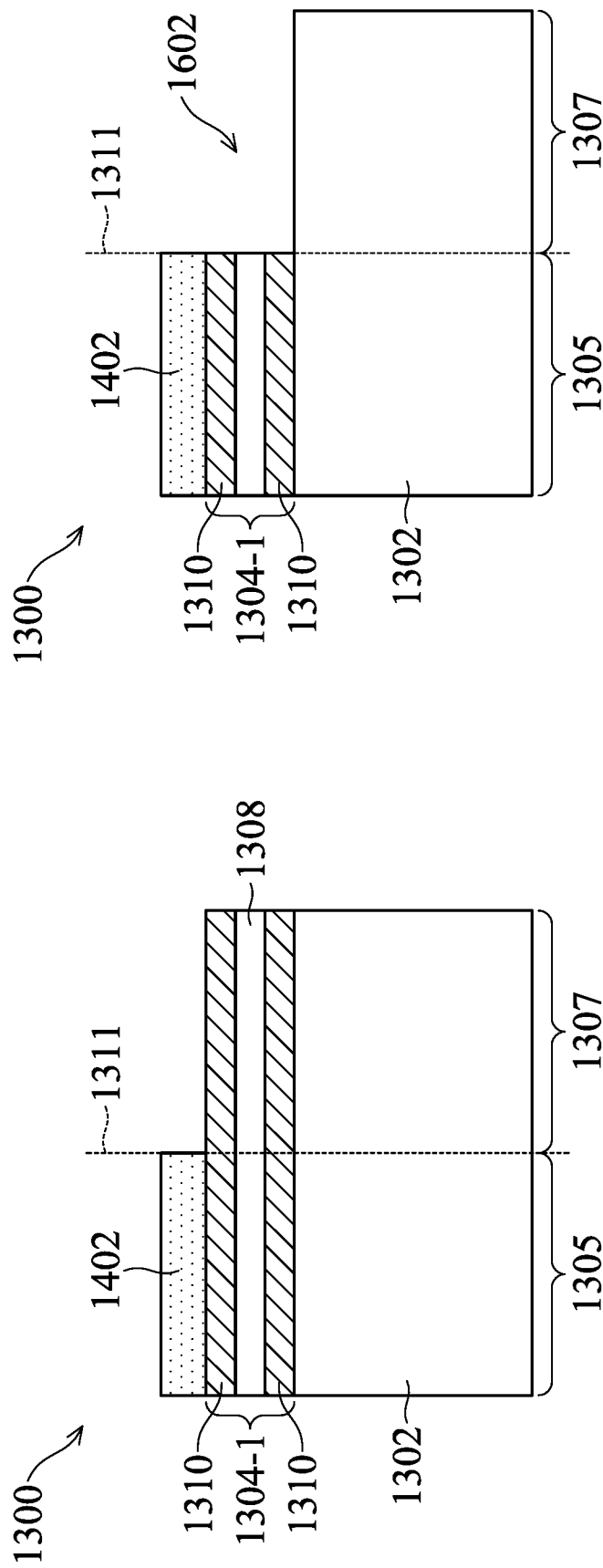
Figure 18:
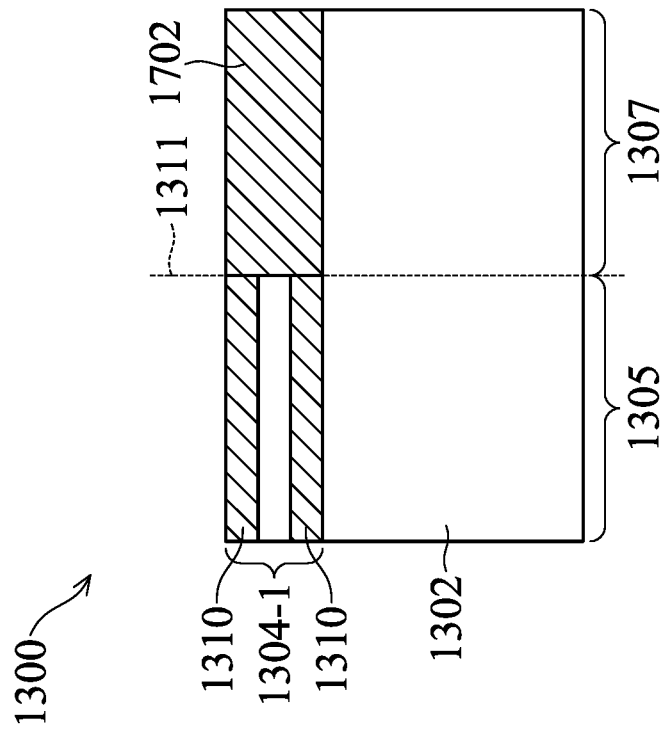
Figure 17:
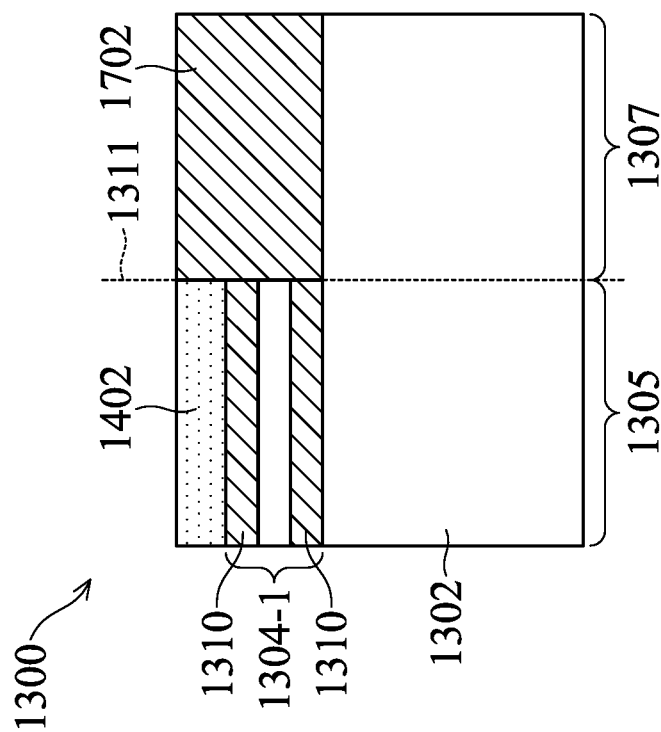

The method 1200 proceeds to block 1206 where a channel layer etch process is performed. Referring to the example of FIG. 15 and FIG. 16, in an embodiment of block 1206 and because the first epitaxial stack 1304-1 includes one (1) epitaxial layer 1308, one (1) epitaxial layer 1308 (semiconductor channel layer) is etched from the core (logic) device region 1307. As shown in the example of FIG. 15 and FIG. 16, while the patterned HM layer 1402 masks the SRAM device region 1305, an etching process is performed to etch the one (1) epitaxial layer 1308 of the first epitaxial stack 1304-1 within the core (logic) device region 1307. More specifically, in some embodiments and while the patterned HM layer 1402 masks the SRAM device region 1305, the etching process may etch the exposed topmost epitaxial layer 1310 in the core (logic) device region 1307, the one (1) epitaxial layer 1308 in the core (logic) device region 1307 that is disposed beneath the topmost epitaxial layer 1310, and the bottommost epitaxial layer 1310 in the core (logic) device region 1307 that is disposed beneath the one (1) epitaxial layer 1308 to form a trench 1602 in the core (logic) device region 1307. In some examples, the etching process may include a wet etch, a dry etch, or a combination thereof. In addition, in some embodiments, one or more different etch chemistries and/or etch processes may be used to effectively etch each of the epitaxial layers 1308, 1310 of the first epitaxial stack 1304-1 in the core (logic) device region 1307. In some examples, the etching process may proceed until the substrate 1302 in the core (logic) device region 1307 is exposed, as shown in the example of FIG. 16. As a result of the channel layer etch process, the device 1300 will include 'N−1' semiconductor channel layers in the core (logic) device region 1307, as mentioned above and as described in more detail below.

After the channel layer etch process (block 1206), the method 1200 proceeds to block 1208 where an epitaxial layer is grown within the core (logic) device region 1307. Referring to the example of FIGS. 16 and 17, in an embodiment of block 1208, an epitaxial layer 1702 is formed over the substrate 1302 and within the trench 1602 of the core (logic) device region 1307. In some embodiments, the epitaxial layer 1702 is composed of the same composition as the epitaxial layers 1310. Thus, in some cases, the epitaxial layer 1702 includes SiGe; however, other embodiments are possible. In various embodiments, the epitaxial layer 1702 may be substantially the same as the epitaxial layer 702, described above.

The method 1200 proceeds to block 1210 where a chemical mechanical polishing (CMP) process is performed. With reference to the example of FIGS. 17 and 18, in an embodiment of block 1210, a CMP process is performed. In some embodiments, the CMP process removes the HM layer 1402 from the SRAM device region 1305 and planarizes a top surface of the device 1300. In some cases, a top portion of the epitaxial layer 1702 may also be removed from the core (logic) device region 1307 during the CMP process, thereby reducing a thickness of the epitaxial layer 1702. In some cases, after the CMP process of block 1210, a top surface of the topmost epitaxial layer 1310 within the SRAM device region 1305 is substantially level with a top surface of the epitaxial layer 1702 within the core (logic) device region 1307.

After the CMP process of block 1210, the method 1200 proceeds to block 1211 where a second epitaxial stack 1304-2 is formed over the substrate 1302. With reference to the example of FIGS. 18 and 19, in an embodiment of block 1211, the second epitaxial stack 1304-2 is formed over the first epitaxial stack 1304-1 (in the SRAM device region 1305) and over the epitaxial layer 1702 (in the core (logic) device region 1307). Like the first epitaxial stack 1304-1, the second epitaxial stack 1304-2 includes the epitaxial layers 1310 of the first composition interposed by the epitaxial layers 1308 of the second composition, as previously described. In some embodiments, another CMP process may be performed after formation of the second epitaxial stack 1304-2.

Figure 19:
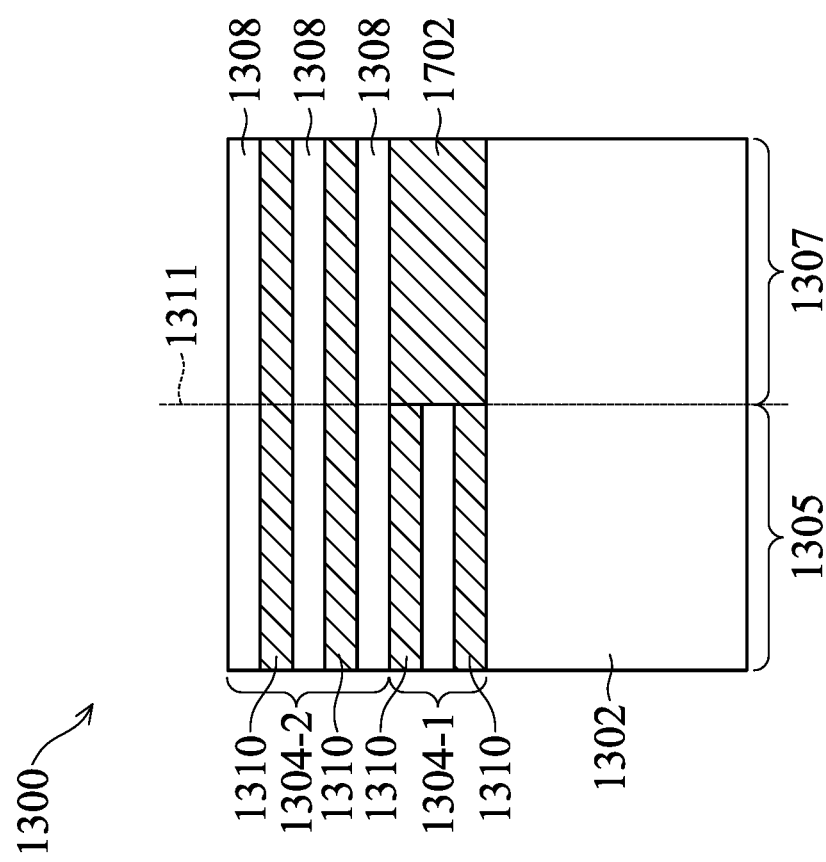

In the example of FIG. 19, the second epitaxial stack 1304-2 includes three (3) epitaxial layers 1308 (interposing two epitaxial layers 1310). Collectively, the first epitaxial stack 1304-1 and the second epitaxial stack 1304-2 provide four (4) epitaxial layers 1308 (semiconductor channel layers) in the SRAM device region 1305. On the other hand, since the one (1) epitaxial layer 1308 was previously etched from the first epitaxial stack 1304-1 in the core (logic) device region 1307, the number of semiconductor channel layers in the core (logic) device region 1307 is equal to the number of epitaxial layers 1308 in the second epitaxial stack 1304-2, which is three (3). As a result, in the example of FIG. 19, the total number of epitaxial layers 1308 in the SRAM device region 1305 'N' is equal to four (4), and the total number of epitaxial layers 1308 in the core (logic) device region 1307 is equal to 'N−1', which is three (3). It is noted that in some embodiments, the number of epitaxial layers 1308 (the number of semiconductor channel layers) for each of the first epitaxial stack 1304-1 and the second epitaxial stack 1304-2 may be different than what is shown and described, for example, to provide other values of 'N' (e.g., such as between 3 and 5) and to provide 'N−2', 'N−3', or 'N−4' semiconductor channel layers in the core (logic) device region 1307.

Further, as noted above, since the epitaxial layers 1308 formed as part of the first epitaxial stack 1304-1 are themselves the layers that are etched from the core (logic) device region 1307, and because the second epitaxial stack 1304-2 is subsequently formed over the first epitaxial stack 1304-1 (in the SRAM device region 1305) and over the epitaxial layer 1702 (in the core (logic) device region 1307), the topmost epitaxial layer 1308 within the SRAM device region 1305 is substantially level with the topmost epitaxial layer 1308 within the core (logic) device region 1307. Indeed, in some embodiments, the topmost epitaxial layer 1308 within each of the SRAM device region 1305 and the core (logic) device region 1307 includes a single, continuous epitaxial layer. As a result, top surfaces of source/drain features subsequently formed within each of the SRAM device region 1305 and the core (logic) device region 1307 will also be substantially level with each other, as described below.

Figure 20:
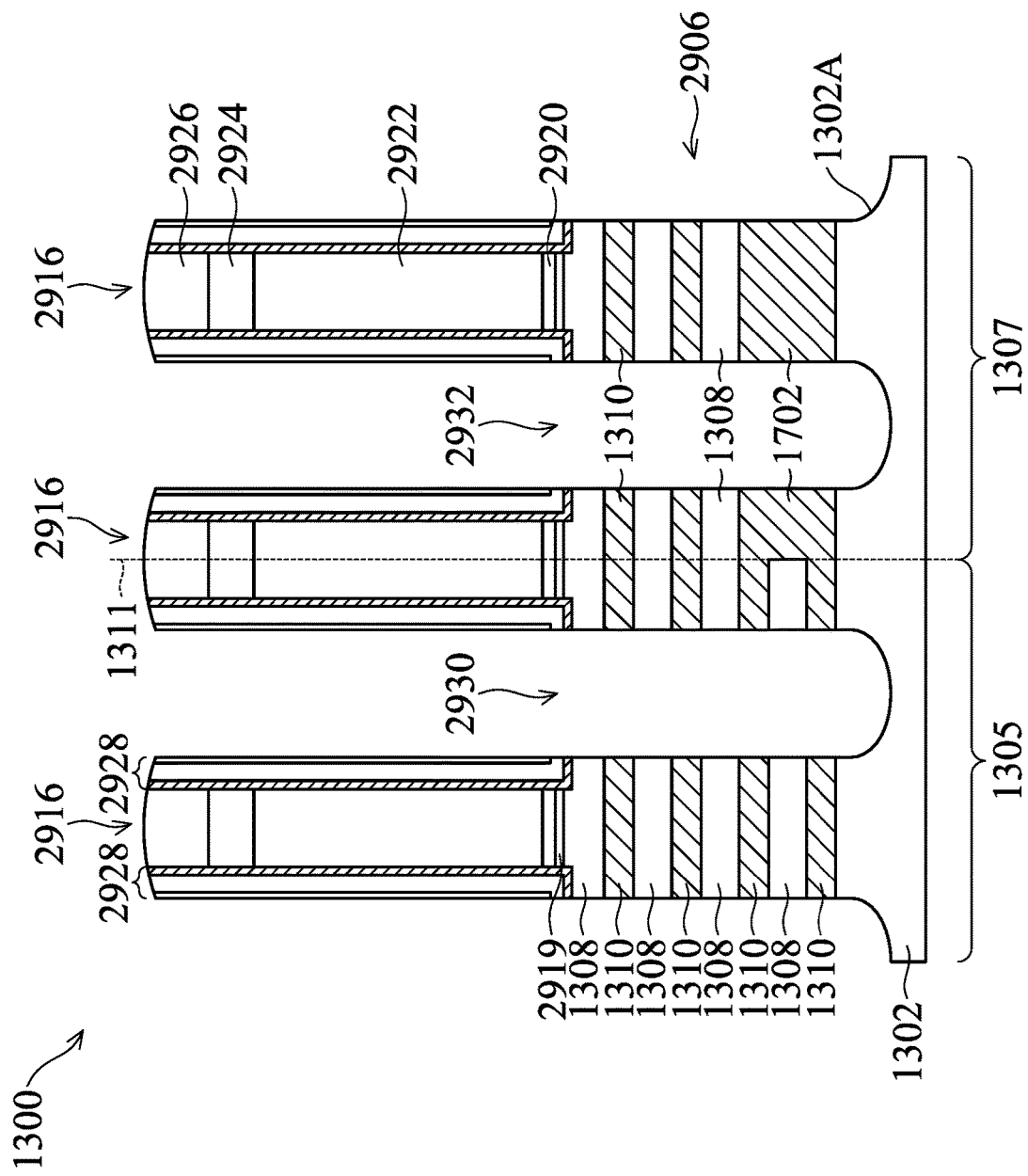

The method 1200 then proceeds to block 1212 where fins and gate stacks are formed. With reference to FIGS. 19 and 20, in an embodiment of block 1212, a plurality of fins, such as a fin 2906, are formed. In some embodiments, the fin 2906 includes a substrate portion 1302A (formed from the substrate 1302), as well as portions of the epitaxial layers 1308, 1310. In addition, portions of the fin 2906 disposed within the core (logic) device region 1307 further include the epitaxial layer 1702, described above. In some cases, shallow trench isolation (STI) features may be formed to isolate the fin 2906 from neighboring fins.

The plurality of fins, including the fin 2906, may be fabricated using suitable processes including photolithography and etch processes, similar to the method described above with reference to the fin 906. The photolithography process may include forming a photoresist layer over the semiconductor device 1300, exposing the resist to a pattern, performing post-exposure bake processes, and developing the resist to form a masking element including the resist. In some embodiments, pattering the resist to form the masking element may be performed using an electron beam (e-beam) lithography process. The masking element may then be used to protect regions of the substrate 1302, and layers formed thereupon, while an etch process (i) forms trenches in unprotected regions through the epitaxial layers 1308, 1310 and into the substrate 1302, in the SRAM device region 1305, and (ii) forms trenches in unprotected regions through the epitaxial layers 1308, 1310, 1702 and into the substrate 1302, in the core (logic) device region 1307. The trenches may be etched using a dry etch (e.g., reactive ion etching), a wet etch, and/or other suitable processes. In various embodiments, the trenches may be filled with a dielectric material forming, for example, STI features interposing the fins.

In a further embodiment of block 1212, gate stacks 2916 are formed over the fin 2906. In an embodiment, the gate stacks 2916 are dummy (sacrificial) gate stacks that are subsequently removed and replaced by the final gate stack at a subsequent processing stage of the device 1300. For example, the gate stacks 2916 may be replaced at a later processing stage by a high-K dielectric layer (HK) and metal gate electrode (MG). While the present discussion is directed to a replacement gate (gate-last) process whereby a dummy gate structure is formed and subsequently replaced, other configurations may be possible (e.g., such as a gate-first process). The portion of the fin 2906 underlying the gate stacks 2916 may be referred to as the channel region of the device 1300, where the channel region includes a total number of epitaxial layers 1308 (semiconductor channel layers) according to the device type being implemented. In the SRAM device region 1305, the portion of the fin 2906 underlying the gate stack 2916 includes four (4) epitaxial layers 1308 ('N' semiconductor channel layers). In the core (logic) device region 1307, the portion of the fin 2906 underlying the gate stack 2916 includes three (3) epitaxial layers 308 ('N−1' semiconductor channel layers). In some cases, as shown in FIG. 20, there may also be a gate stack 2916 formed at the boundary 1311 between the SRAM device region 1305 and the core (logic) device region 1307. In some examples, the portion of the fin 2906 underlying the gate stack 2916 at the boundary 1311 includes four (4) epitaxial layers 1308 on a first side of the boundary 1311 and three (3) epitaxial layers 1308 on a second side of the boundary 1311. The gate stacks 2916 may also define a source/drain region of the fin 2906, for example, the regions of the fin 2906 adjacent to and on opposing sides of the channel region.

In some embodiments, the gate stacks 2916 include a dielectric layer 2920 and an electrode layer 2922. The gate stacks 2916 may also include one or more hard mask layers 2924, 2926. In some embodiments, the hard mask layer 2924 may be substantially the same as the hard mask layer 924, described above. In some examples, the hard mask layer 2926 may be substantially the same as the hard mask layer 926, described above. In some embodiments, the dielectric layer 2920 may be substantially the same as the dielectric layer 920, described above. In some cases, the electrode layer 2922 may be substantially the same as the electrode layer 922, described above. In some examples, an optional sacrificial layer 2919 may be formed directly beneath the dielectric layer 2920. The optional sacrificial layer 2919 may be substantially the same as the optional sacrificial layer 919, described above. In some embodiments, one or more spacer layers 2928 may be formed on sidewalls of the gate stacks 2916. In some cases, the one or more spacer layers 2928 may be substantially the same as the one or more spacer layers 928, described above.

The method 1200 then proceeds to block 1214 where a source/drain etch process is performed. Still with reference to FIG. 20, in an embodiment of block 1214, a source/drain etch process is performed to the device 1300. In some embodiments, the source/drain etch process is performed to remove the exposed epitaxial layers 1308, 1310 in source/drain regions of SRAM device region 1305, and to remove the exposed epitaxial layers 1308, 1310, 1702 in source/drain regions of the core (logic) device region 1307, to form trenches 2930, 2932 which expose underlying portions of the substrate 1302. The source/drain etch process also serves to expose lateral surfaces of the epitaxial layers 1308, 1310 in the SRAM device region 1305 and to expose lateral surfaces of the epitaxial layers 1308, 1310, 1702 in the core (logic) device region 1307, as shown in FIG. 20. In some embodiments, the source/drain etch process may also remove portions of the one or more spacer layers 2928 (e.g., from top surfaces of the gate stacks 2916). In some embodiments, the source/drain etch process may include a dry etching process, a wet etching process, and/or a combination thereof.

Figure 21:
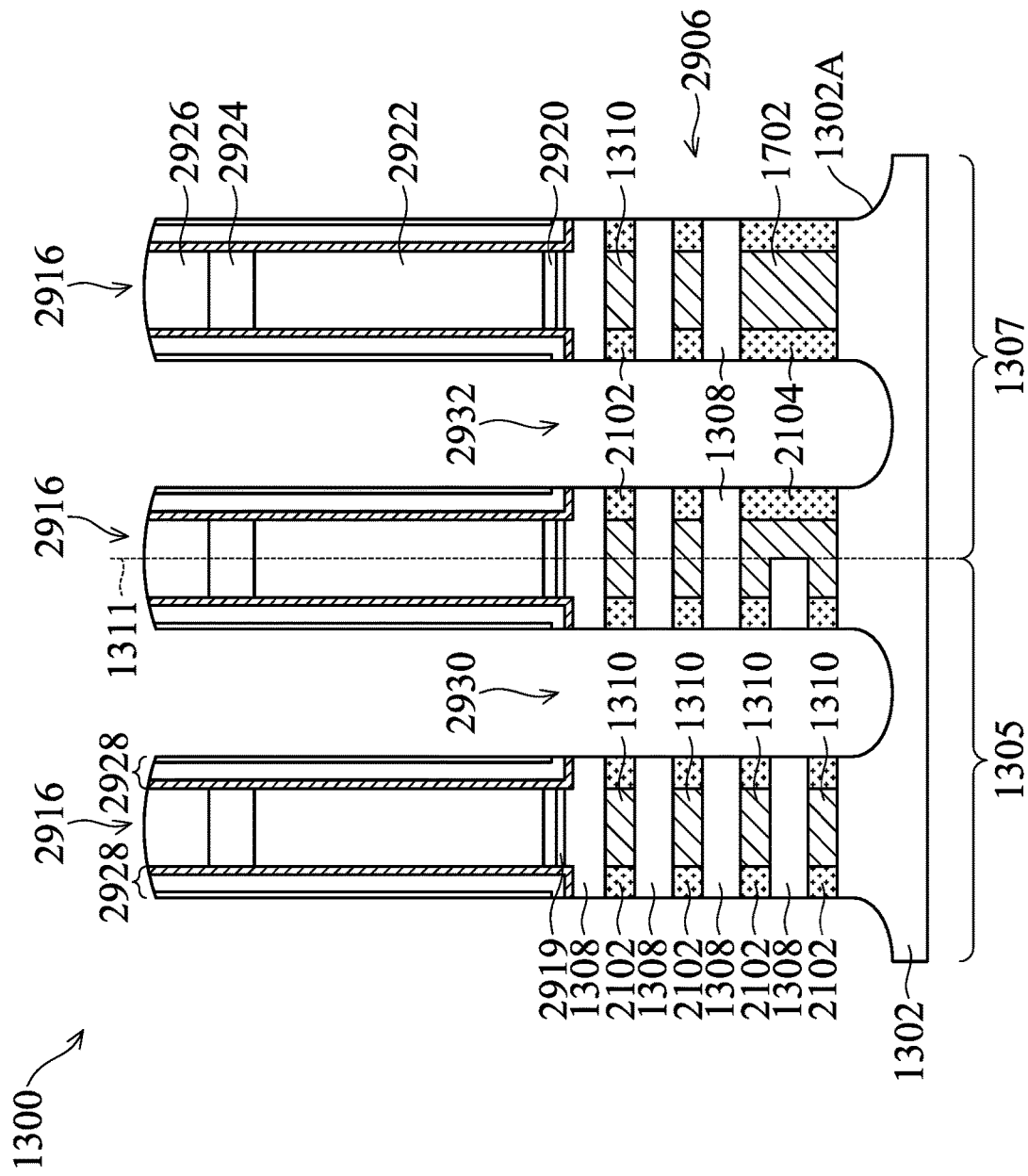

The method 1200 then proceeds to block 1216 where inner spacers are formed. Referring to FIG. 20 and FIG. 21, in an embodiment of block 1216, a dummy layer recess process is initially performed to the device 1300. The dummy layer recess process includes a lateral etch of the epitaxial layers 1310 in the SRAM device region 1305 and a lateral etch of the epitaxial layers 1310, 1702 in the core (logic) device region 1307 to form recesses along sidewalls of the trenches 2930, 2932. In some embodiments, the dummy layer recess process may be substantially the same as described above with reference to block 216 of the method 200. During a later stage of processing, as discussed below, the epitaxial layers 1310 in the SRAM device region 1305, and the epitaxial layers 1310, 1702 in the core (logic) device region 1307, will be removed and replaced by a portion of a gate structure (e.g., a metal gate structure). In various examples, the replacement gate structure will interface an inner spacer, as also described in more detail below.

In a further embodiment of block 1216, an inner spacer material is deposited over the device 1300 and within the trenches 2930, 2932. The inner spacer material is also deposited within the recesses formed along sidewalls of the trenches 2930, 2932 during the dummy layer recess process. In some embodiments, the inner spacer material and deposition process is substantially the same as described above with reference to block 216 of the method 200.

In a further embodiment of block 1216, an inner spacer etch-back process (trim process) may be performed to the device 1300. In various examples, the inner spacer etch-back process etches (trims) the previously deposited inner spacer material from over the device 1300 and along sidewalls of the trenches 2930, 2932, while the inner spacer material remains at least partially disposed within the recesses disposed along the sidewalls of the trenches 2930, 2932, thereby providing inner spacers 2102 in the SRAM device region 1305 and inner spacers 2102, 2104 in the core (logic) device region 1307. By way of example, the inner spacer etch-back process may be substantially the same as described above with reference to block 216 of the method 200. In some cases, any residual portions of the inner spacer material that remain on top surfaces of the device 1300 and/or on sidewalls or bottom surfaces of the trenches 2930, 2932, for example after the inner spacer etch-back process, may be removed during a subsequent clean process (e.g., prior to epitaxial growth of source/drain features). In various examples, the inner spacer material (e.g., that remains disposed within the recesses and defines the inner spacers 2102 in the SRAM device region 1305 and the inner spacers 2102, 2104 in the core (logic) device region 1307) may be disposed at least partially beneath the one or more spacer layers 2928 (formed on sidewalls of the gate stacks 2916) while abutting subsequently formed source/drain features, as described below.

Figure 22:
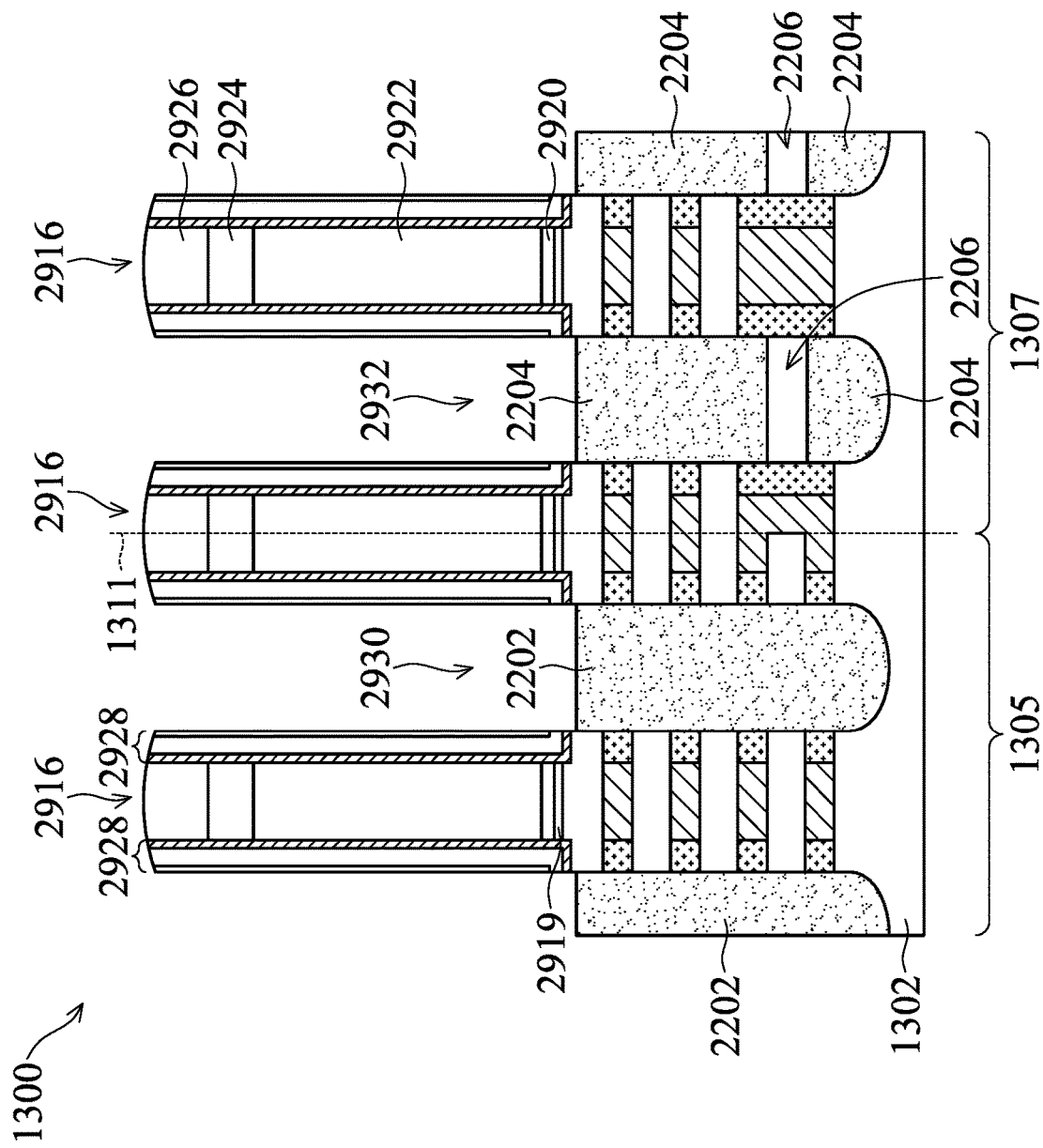

The method 1200 then proceeds to block 1218 where source/drain features are formed. Referring to FIGS. 21 and 22, in an embodiment of block 1218, source/drain features 2202 are formed in the trench 2930 within the SRAM device region 1305, and source/drain features 2204 are formed in the trench 2932 within the core (logic) device region 1307, over the exposed portions of the substrate 1302. The source/drain features 2202, 2204 are formed in source/drain regions adjacent to and on either side of the gate stacks 2916 of the device 1300. In some embodiments, the source/drain features 2202 are in contact with the adjacent inner spacers 2102 and the semiconductor channel layers (the epitaxial layers 1308) within the SRAM device region 1305. In some examples, the source/drain features 2204 are in contact with the adjacent inner spacers 2102, 2104 and the semiconductor channel layers (the epitaxial layers 1308) within the core (logic) device region 1307.

In some embodiments, the source/drain features 2202, 2204 are formed by epitaxially growing a semiconductor material layer in the source/drain regions. The epitaxial growth of the source/drain features 2202 may occur simultaneously with the epitaxial growth of the source/drain features 2204 (e.g., using a single epitaxial growth process). Alternatively, in some cases, the source/drain features 2202 and the source/drain features 2204 may be formed using separate epitaxial growth processes (e.g., a first process for the SRAM device region 1305 and a second process for the core (logic) device region 1307). Regardless of whether they are formed simultaneously or separately, and in contrast to the source/drain features discussed above with reference to the method 200, it is noted that a top surface of the source/drain features 2202 are substantially level with a top surface of the source/drain features 2204.

In some embodiments, the source/drain features 2202, 2204 may selectively grow over the exposed portions of the substrate 1302 and on exposed surfaces of the epitaxial layers 1308 (the semiconductor channel layers), while not completely forming along exposed surfaces of the inner spacers 2102, 2104 since the inner spacers 2102, 2104 include a dielectric layer. Because the method 1200 provides for etching the first one or two epitaxial layers formed over the substrate 1302 (as part of the first epitaxial stack 1304-1) within the core (logic) device region 1307, while the second epitaxial stack 1304-2 is subsequently formed, as described above, the topmost epitaxial layer 1308 within the SRAM device region 1305 is substantially level with the topmost epitaxial layer 1308 within the core (logic) device region 1307. As a result, top surfaces of source/drain features 2202, 2204 within each of the SRAM device region 1305 and the core (logic) device region 1307, which selectively grow over the exposed portions of the substrate 1302 and on exposed surfaces of the epitaxial layers 1308, will also be substantially level with each other.

However, in some embodiments, etching the first one or two epitaxial layers formed over the substrate 1302 (as part of the first epitaxial stack 1304-1) within the core (logic) device region 1307 may result in the formation of gaps 2206 near bottom portions of the source/drain features 2204. The gaps 2206 may be formed, for example, as a result of the source/drain features 2204 not having the bottommost epitaxial layer 1308 (which was previously etched) on which to selectively grow. In contrast, the source/drain features 2202 are substantially uniform (e.g., without gaps) since there were no epitaxial layers 1308 etched from the SRAM device region 1305. To be sure, in some embodiments, the gaps 2206 may enhance performance of the device 1300, for example, because the gaps 2206 will reduce/prevent leakage current flowing thereacross and because the gaps 2206 will provide a low-K dielectric region (e.g., air) that will reduce parasitic capacitance.

In some embodiments, a clean process may be performed immediately prior to formation of the source/drain features 2202, 2204. The clean process may include a wet etch, a dry etch, or a combination thereof. In addition, the clean process may remove any residual portions of the inner spacer material that remained on top surfaces of the device 1300 and/or on sidewalls or bottom surfaces of the trenches 2930, 2932 (e.g., after the inner spacer etch-back process).

In various embodiments, the semiconductor material layer grown to form the source/drain features 2202, 2204, the epitaxial growth methods, and the doping (if any) of the source/drain features 2202, 2204 may be substantially the same as described above with reference to the source/drain features 1102, 1104.

The method 1200 then proceeds to block 1220 where further processing is performed to the device 1300. For example, after formation of the source/drain features 2202, 2204 (block 1218), a contact etch stop layer (CESL) and an inter-layer dielectric (ILD) layer are formed over the device 1300 and a CMP process is performed. In some embodiments, the CMP process may expose a top surface of the gate stacks 2916 (e.g., by removing portions of the ILD layer and CESL) overlying the gate stacks 2916 and planarize a top surface of the device 1300. In addition, the CMP process may remove the hard mask layers 2924, 2926 overlying the gate stacks 2916 to expose the underlying electrode layer 2922, such as a polysilicon electrode layer, of the dummy gate.

In a further embodiment of block 1220, the exposed electrode layer 2922 of the gate stacks 2916 may initially be removed by suitable etching processes, followed by an etching process to remove the dielectric layer 2920, and the optional sacrificial layer 2919 (if included), from the gate stacks 2916. In some examples, the etching processes may include a wet etch, a dry etch, or a combination thereof.

After removal of the dummy gates, and in a further embodiment of block 1220, the epitaxial layers 1310 (dummy layers) in the channel region of the SRAM device region 1305 are selectively removed (e.g., using a selective etching process), while the 'N' semiconductor channel layers (epitaxial layers 1308) remain unetched, and the epitaxial layers 1310, 1702 (dummy layers) in the channel region of the core (logic) device region 1307 are selectively removed (e.g., using a selective etching process), while the 'N–1' semiconductor channel layers (epitaxial layers 1308) remain unetched. As a result of the selective removal of the dummy layers, gaps are formed between the adjacent epitaxial layers 1308, with the inner spacers 2102 disposed on opposing lateral ends of the gaps in the SRAM device region 1305, and with the inner spacers 2102, 2104 disposed on opposing lateral ends of the gaps in the core (logic) device region 1307.

After selective removal of the dummy layers, and in a further embodiment of block 1220, a gate structure is formed. The gate structure may include a high-K/metal gate stack, however other compositions are possible. In some embodiments, the gate structure may form the gate associated with the multi-channels provided by the plurality of exposed semiconductor channel layers (the exposed epitaxial layers 1308) in each of the SRAM device region 1305 and the core (logic) device region 1307. In some embodiments, the gate structure includes an interfacial layer (IL) disposed on exposed surfaces of the epitaxial layers 1308, and a high-K dielectric layer formed over the IL. In some embodiments, the IL and the high-K dielectric layer may be substantially the same as described above with reference to the method 200. In some examples, the high-K dielectric layer may also be formed on exposed surfaces of the inner spacers 2102 or 2102, 2104 on opposing lateral ends of the gaps. In various embodiments, the IL and the high-K dielectric layer collectively define a gate dielectric of the gate structure for the device 1300.

In a further embodiment of block 1220, a metal gate including a metal layer is formed over the gate dielectric (e.g., over the IL and the high-K dielectric layer). The metal layer may be substantially the same as described above with reference to the method 200. Additionally, the formation of the gate dielectric/metal gate stack may include depositions to form various gate materials, one or more liner layers, and one or more CMP processes to remove excessive gate materials and thereby planarize a top surface of the device 1300. In various embodiments, the formed gate structure includes portions that interpose each of the epitaxial layers 1308, which each provide semiconductor channel layers for the device 1300.

Generally, the semiconductor device 1300 may undergo further processing to form various features and regions known in the art. For example, further processing may form various contacts/vias/lines and multilayer interconnect features (e.g., metal layers and interlayer dielectrics) on the substrate 1302, configured to connect the various features to form a functional circuit that may include one or more multi-gate devices (e.g., one or more GAA transistors). In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 1200, and some process steps described above may be modified, replaced, or eliminated in accordance with various embodiments of the method 1200. It is also noted that while the method 1200 has been described with reference the SRAM device region 1305 and the core (logic) device region 1307, it will be understood that aspects of the method 1200 may equally apply to fabrication of other device types formed in other device regions (e.g., such as analog devices).

With respect to the description provided herein, disclosed are methods and structures for providing multi-gate devices (e.g., such as a GAA transistors) having a number of semiconductor channel layers selected based on the device type being implemented by the multi-gate device. GAA transistors may be used in a variety of device types, for example, to implement core (logic) devices and SRAM devices, among others. With respect to such various device types implemented using GAA transistors, and in some embodiments, core (logic) devices may be implemented using a fewer number of semiconductor channel layers as compared to SRAM devices. In some examples, core (logic) devices may be implemented using a fewer number of semiconductor channel layers in order to reduce total device capacitance and provide increased device speed (e.g., including improved AC performance). Alternatively, in various embodiments, SRAM devices may be implemented using a greater number of semiconductor channel layers in order to provide increased cell current, as well as to reduce variation of transistor threshold voltage and transistor current. Generally, by providing multi-gate devices having a number of semiconductor channel layers selected based on the device type being implemented (e.g., core or SRAM device), embodiments of the present disclosure provide methods and device structures that are able to meet the diverse performance requirements of a variety of different device types simultaneously. Those of skill in the art will readily appreciate that the methods and structures described herein may be applied to a variety of other semiconductor devices to advantageously achieve similar benefits from such other devices without departing from the scope of the present disclosure.

Thus, one of the embodiments of the present disclosure described a method including providing a substrate having an epitaxial stack of layers including a plurality of semiconductor channel layers interposed by a plurality of dummy layers. In some embodiments, the substrate includes a first device type region and a second device type region. In some embodiments, the method further includes performing a channel layer etch process to remove a first portion of the epitaxial stack of layers from the second device type region to form a trench in the second device type region that exposes a second portion of the epitaxial stack of layers, where the removed first portion of the epitaxial stack of layers includes at least one semiconductor channel layer of the plurality of semiconductor channel layers. In some examples, the method further includes forming an epitaxial layer within the trench in the second device type region and over the second portion of the epitaxial stack of layers, where a top surface of the epitaxial layer in the second device type region is substantially level with a top surface of the epitaxial stack of layers in the first device type region.

In another of the embodiments, discussed is a method that includes providing a substrate having a first epitaxial stack of layers including at least one epitaxial layer of a first composition interposing a first plurality of epitaxial layers of a second composition. In some embodiments, the substrate includes a first device type region and a second device type region. In some examples, the method further includes etching the at least one epitaxial layer of the first composition and the first plurality of epitaxial layers of the second composition from the second device type region to form a trench in the second device type region that exposes a portion of the substrate. In some embodiments, the method further includes forming an epitaxial layer of a third composition within the trench in the second device type region, where a top surface of the epitaxial layer of the third composition in the second device type region is substantially level with a top surface of the first epitaxial stack of layers in the first device type region. In some cases, the method further includes forming a second epitaxial stack of layers over the first stack of epitaxial layers in the first device type region and over the epitaxial layer of the third composition in the second device type region, where the second epitaxial stack of layers includes a plurality of epitaxial layers of the first composition interposed by a second plurality of epitaxial layers of the second composition.

In yet another of the embodiments, discussed is a semiconductor device including a first transistor in a first device type region of a substrate, where the first transistor includes a first gate structure and a first source/drain feature adjacent to the first gate structure. In some embodiments, the semiconductor device further includes a second transistor in a second device type region of the substrate, where the second transistor includes a second gate structure and a second source/drain feature adjacent to the second gate structure. In some embodiments, the first transistor includes a first fin having a first number of semiconductor channel layers in lateral contact with the first source/drain feature, the second transistor includes a second fin having a second number of semiconductor channel layers in lateral contact with the second source/drain feature, and the second number of semiconductor channel layers is less than the first number of semiconductor channel layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
    providing a substrate including an epitaxial stack of layers including a plurality of semiconductor channel layers interposed by a plurality of dummy layers, wherein the substrate includes a first device type region and a second device type region;
    performing a channel layer etch process to remove a first portion of the epitaxial stack of layers from the second device type region to form a trench in the second device type region, wherein the channel layer etch process proceeds until a second portion of the epitaxial stack of layers is exposed, and wherein the removed first portion of the epitaxial stack of layers includes at least one semiconductor channel layer of the plurality of semiconductor channel layers; and
    forming an epitaxial layer within the trench in the second device type region and over the second portion of the epitaxial stack of layers, wherein a top surface of the epitaxial layer in the second device type region is level with a top surface of the epitaxial stack of layers in the first device type region.

2. The method of claim 1, wherein the first device type region includes a static random-access memory (SRAM) device region, and wherein the second device type region includes a core (logic) device region.

3. The method of claim 1, wherein a first total number of semiconductor channel layers in the first device type region is equal to 'N', and wherein a second total number of semiconductor channel layers in the second device type region is equal to 'N−1' or 'N−2'.

4. The method of claim 1, further comprising:
after forming the epitaxial layer within the trench in the second device type region, forming a fin within the first device type region and within the second device type region;
wherein the fin within the first device type region includes a portion of the substrate and the epitaxial stack of layers disposed over the portion of the substrate; and
wherein the fin within the second device type region includes the portion of the substrate, the second portion of the epitaxial stack of layers disposed over the portion of the substrate, and the epitaxial layer disposed over the second portion of the epitaxial stack of layers.

5. The method of claim 1, further comprising:
after forming the epitaxial layer within the trench in the second device type region, forming a fin within the first device type region and within the second device type region; and
forming a first gate structure over the fin in the first device type region and a second gate structure over the fin in the second device type region.

6. The method of claim 5, wherein the first gate structure corresponds to a first transistor, wherein the second gate structure corresponds to a second transistor, and wherein the first and second transistors both include gate-all-around (GAA) transistors.

7. The method of claim 1, further comprising:
prior to performing the channel layer etch process, forming a patterned hard mask (HM) layer over the semiconductor device, wherein the patterned HM layer exposes the epitaxial stack of layers in the second device type region while the first device type region remains masked by the patterned HM layer; and
performing the channel layer etch process to remove the first portion of the epitaxial stack of layers from the second device type region.

8. The method of claim 1, wherein the at least one semiconductor channel layer of the plurality of semiconductor channel layers that is removed from the second device type region using the channel layer etch process includes a topmost semiconductor channel layer of the epitaxial stack of layers.

9. The method of claim 1, wherein the epitaxial layer formed within the trench in the second device type region is composed of a same material as the plurality of dummy layers.

10. The method of claim 1, further comprising:
after forming the epitaxial layer within the trench in the second device type region, forming a fin and gate structures within each of the first device type region and the second device type region;
performing a source/drain etch process to form a plurality of trenches disposed on opposing sides of the gate structures within each of the first device type region and the second device type region; and
forming first source/drain features in the plurality of trenches within the first device type region and forming second source/drain features in the plurality of trenches within the second device type region;
wherein a top surface of the first source/drain features is offset from a top surface of the second source/drain features.

11. A method of fabricating a semiconductor device, comprising:
providing a substrate including a first epitaxial stack of layers including at least one epitaxial layer of a first composition interposing a first plurality of epitaxial layers of a second composition, wherein the substrate includes a first device type region and a second device type region;
etching the at least one epitaxial layer of the first composition and the first plurality of epitaxial layers of the second composition from the second device type region to form a trench in the second device type region that exposes a portion of the substrate;
forming an epitaxial layer of a third composition within the trench in the second device type region, wherein a top surface of the epitaxial layer of the third composition in the second device type region is level with a top surface of the first epitaxial stack of layers in the first device type region; and
forming a second epitaxial stack of layers over the first stack of epitaxial layers in the first device type region and over the epitaxial layer of the third composition in the second device type region, the second epitaxial stack of layers including a plurality of epitaxial layers of the first composition interposed by a second plurality of epitaxial layers of the second composition.

12. The method of claim 11, wherein the at least one epitaxial layer of the first composition and the plurality of epitaxial layers of the first composition include silicon (Si), and wherein the first plurality of epitaxial layers of the second composition and the second plurality of epitaxial layers of the second composition include silicon germanium (SiGe).

13. The method of claim 11, wherein the epitaxial layer of the third composition is composed of a same material as the first plurality of epitaxial layers of the second composition and the second plurality of epitaxial layers of the second composition.

14. The method of claim 11, wherein the first device type region includes a static random-access memory (SRAM) device region, and wherein the second device type region includes a core (logic) device region.

15. The method of claim 11, wherein a first total number of epitaxial layers of the first composition in the first device type region is equal to 'N', and wherein a second total number of epitaxial layers of the first composition in the second device type region is equal to 'N−1' or 'N−2'.

16. The method of claim 11, further comprising:
after forming the second epitaxial stack of layers over the first stack of epitaxial layers in the first device type region and over the epitaxial layer of the third composition in the second device type region, forming a fin and gate structures within each of the first device type region and the second device type region; and
forming first source/drain features on opposing sides of the gate structures within the first device type region and forming second source/drain features on opposing sides of the gate structures within the second device type region;
wherein a top surface of the first source/drain features are level with a top surface of the second source/drain features.

17. The method of claim 16, wherein the forming the second source/drain features results in the formation of gaps near bottom portions of the second source/drain features.

18. A method, comprising:
performing a channel layer etch process to remove a first part of an epitaxial stack of layers from a core (logic) device region to form a trench, wherein the channel layer etch process proceeds until a second part of the epitaxial stack of layers in the core (logic) device region is exposed; and
forming an epitaxial layer within the trench in the core (logic) device region and over the exposed second part of the epitaxial stack of layers;
wherein a first total number of semiconductor channel layers in a static random-access memory (SRAM) device region is equal to 'N', and wherein a second total number of semiconductor channel layers in the core (logic) device region is equal to 'N−1' or 'N−2'.

19. The method of claim 18, wherein a top surface of the epitaxial layer formed in the trench of the core (logic) device region is level with a top surface of the epitaxial stack of layers formed in the SRAM device region.

20. The method of claim 18, further comprising:
after forming the epitaxial layer within the trench in the core (logic) device region, forming a fin within the SRAM device region and within the core (logic) device region.

* * * * *